(12) United States Patent
Ikeda et al.

(10) Patent No.: US 7,830,295 B2
(45) Date of Patent: Nov. 9, 2010

(54) A/D CONVERTER

(75) Inventors: Shinichi Ikeda, Tokyo (JP); Hirotomo Ishii, Tokyo (JP); Yoshikazu Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 12/427,495

(22) Filed: Apr. 21, 2009

(65) Prior Publication Data
US 2010/0001891 A1 Jan. 7, 2010

(30) Foreign Application Priority Data
Jul. 1, 2008 (JP) .............................. 2008-172404

(51) Int. Cl.
*H03M 1/12* (2006.01)

(52) U.S. Cl. ...................... 341/172; 341/118; 341/155; 341/156

(58) Field of Classification Search ................ 341/118, 341/155, 156, 172
See application file for complete search history.

(56) References Cited

U.S. PATENT DOCUMENTS

| 4,012,247 | A | * | 3/1977 | Eigenmann | 156/71 |
|---|---|---|---|---|---|
| 4,907,002 | A | * | 3/1990 | Kawada | 341/172 |
| 4,983,974 | A | * | 1/1991 | Mijuskovic | 341/156 |
| 5,258,761 | A | * | 11/1993 | Fotouhi et al. | 341/172 |
| 6,304,208 | B1 | * | 10/2001 | Nagashima | 341/172 |
| 6,686,865 | B2 | * | 2/2004 | Confalonieri et al. | 341/172 |
| 6,714,151 | B2 | * | 3/2004 | Tachibana et al. | 341/155 |
| 2003/0234736 | A1 | * | 12/2003 | Tachibana et al. | 341/172 |
| 2008/0158028 | A1 | * | 7/2008 | Yang et al. | 341/118 |

FOREIGN PATENT DOCUMENTS

JP 04-152717 5/1992
JP 2008-005001 1/2008

* cited by examiner

*Primary Examiner*—Jean B Jeanglaude
(74) *Attorney, Agent, or Firm*—Knobbe, Martens, Olson & Bear LLP

(57) ABSTRACT

In an A/D converter, three capacitors are connected to a comparator. The A/D converter also includes three switching circuits that each input a first reference voltage, a second reference voltage, and a third reference voltage in the three capacitors. A control circuit selects at least two of the three switching circuits during a charging period of stray capacitance of each of the capacitors. The control circuit turns on one of the switching devices in the selected switching circuits simultaneously, and during a comparing period by the comparator, selects one of the three capacitors for each comparison, and selects another capacitor in the next comparison.

20 Claims, 14 Drawing Sheets

FIG.3

|  | | | | | | |
|---|---|---|---|---|---|---|
| C1 SAMPLING | CHARGING STRAY CAPACITANCE (3/4) | CHARGING STRAY CAPACITANCE (3/4) | COMPARISON MSB-1 | CHARGING STRAY CAPACITANCE (11/16) | COMPARISON MSB-3 | CHARGING STRAY CAPACITANCE (43/64) |
| C2 SAMPLING | CHARGING STRAY CAPACITANCE (1/2) | COMPARISON MSB | CHARGING STRAY CAPACITANCE (7/8) | CHARGING STRAY CAPACITANCE (9/16) | CHARGING STRAY CAPACITANCE (23/32) | CHARGING STRAY CAPACITANCE (41/64) |
| C3 SAMPLING | CHARGING STRAY CAPACITANCE (1/4) | CHARGING STRAY CAPACITANCE (1/4) | CHARGING STRAY CAPACITANCE (5/8) | COMPARISON MSB-2 | CHARGING STRAY CAPACITANCE (21/32) | COMPARISON MSB-4 |

FIG.5

| | | | | | | | | | | |
|---|---|---|---|---|---|---|---|---|---|---|
| C1 SAMPLING | CHARGING STRAY CAPACITANCE (3/4) | | COM-PARISON MSB-1 | | CHARGING STRAY CAPACITANCE (11/16) | | | | CHARGING STRAY CAPACITANCE (43/64) | |
| C2 SAMPLING | CHARGING STRAY CAPACITANCE (1/2) | COM-PARISON MSB | | | CHARGING STRAY CAPACITANCE (5/8) | COM-PARISON MSB-2 | | COM-PARISON MSB-3 | CHARGING STRAY CAPACITANCE (21/32) | COM-PARISON MSB-4 |
| C3 SAMPLING | CHARGING STRAY CAPACITANCE (1/4) | | | | CHARGING STRAY CAPACITANCE (9/16) | | | | CHARGING STRAY CAPACITANCE (41/64) | |

FIG.9

| | | PHASE A | | | | ... | PHASE B | | | | | |
|---|---|---|---|---|---|---|---|---|---|---|---|---|
| C1 | SAM-PLING | CHARGING STRAY CAPACI-TANCE (3/4) | | COM-PARISON MSB-1 | CHARGING STRAY CAPACI-TANCE (11/16) | | CHARGING STRAY CAPACI-TANCE MSB-7 | COM-PARISON MSB-7 | CHARGING STRAY CAPACI-TANCE MSB-8 | COM-PARISON MSB-8 | CHARGING STRAY CAPACI-TANCE MSB-9 | COM-PARISON MSB-9 |
| C2 | SAM-PLING | CHARGING STRAY CAPACI-TANCE (1/2) | COM-PARISON MSB | | CHARGING STRAY CAPACI-TANCE (5/8) | COM-PARISON MSB-2 | CHARGING STRAY CAPACI-TANCE MSB-7 | COM-PARISON MSB-7 | CHARGING STRAY CAPACI-TANCE MSB-8 | COM-PARISON MSB-8 | CHARGING STRAY CAPACI-TANCE MSB-9 | COM-PARISON MSB-9 |
| C3 | SAM-PLING | CHARGING STRAY CAPACI-TANCE (1/4) | | | CHARGING STRAY CAPACI-TANCE (9/16) | | CHARGING STRAY CAPACI-TANCE MSB-7 | COM-PARISON MSB-7 | CHARGING STRAY CAPACI-TANCE MSB-8 | COM-PARISON MSB-8 | CHARGING STRAY CAPACI-TANCE MSB-9 | COM-PARISON MSB-9 |

A/D CONVERTER

CROSS-REFERENCE TO RELATED APPLICATIONS

This application is based upon and claims the benefit of priority from the prior Japanese Patent Application No. 2008-172404, filed on Jul. 1, 2008; the entire contents of which are incorporated herein by reference.

BACKGROUND OF THE INVENTION

1. Field of the Invention

The present invention relates to an analog-to-digital (A/D) converter, and is preferably applied to a successive approximation A/D converter employing a chopper comparator.

2. Description of the Related Art

In successive approximation A/D converters, consumption of power and voltage therefor can be reduced by using a chopper comparator to compare an analog input voltage with a reference voltage (Japanese Patent Application Laid-open No. 2008-5001). In such successive approximation A/D converters, a D/A converter that generates a reference voltage according to the A/D converted value in more significant bits by using a ladder resistor is provided, and an analog input voltage is sampled and then, is stored in a capacitor. The analog input voltage sampled on the capacitor is compared with a reference voltage successively, and thus, A/D conversion for each bit is successively performed.

In conventional successive approximation A/D converters, charging operation of stray capacitance of a capacitor and comparison thereof are performed successively each time A/D conversion for each bit is performed. Therefore, unfortunately A/D conversion takes time and conversion rate is low.

BRIEF SUMMARY OF THE INVENTION

An analog-to-digital converter according to an embodiment of the present invention comprises: a first capacitor, a second capacitor, and a third capacitor that each sample an analog input voltage in cooperation with a first switching circuit, a second switching circuit, and a third switching circuit, respectively; a reference voltage generation circuit that generates a first reference voltage, a second reference voltage, and a third reference voltage for the first capacitor, the second capacitor, and the third capacitor, respectively, and that applies the first reference voltage, the second reference voltage, and the third reference voltage to one terminal of each of the first capacitor, the second capacitor, and the third capacitor, respectively; a comparator that determines magnitude relationship between the analog input voltage and the first reference voltage, the second reference voltage, and the third reference voltage by comparing a voltage at another terminal of each of the first capacitor, the second capacitor, and the third capacitor with a predetermined value; a charging timing controller that controls the reference voltage generation circuit to apply two reference voltages that are possibly referred to for obtaining an analog-to-digital converted value at an (N+1)th most significant bit to one terminal of two of the first capacitor, the second capacitor, and the third capacitor before an analog-to-digital converted value at an Nth most significant bit is determined, where N is an integer that is larger than or equal to 1; and a comparing timing controller that controls the comparator to determine an analog-to-digital converted value at the (N+1)th most significant bit by controlling the comparator to compare a voltage at another terminal of one of the first capacitor, the second capacitor, and the third capacitor whose one terminal is applied with a reference voltage according to the analog-to-digital converted value at the Nth most significant bit with a predetermined value after the analog-to-digital converted value at the Nth most significant bit is determined.

An analog-to-digital converter according to an embodiment of the present invention comprises: a first capacitor, a second capacitor, and a third capacitor that each sample an analog input voltage in cooperation with a first switching circuit, a second switching circuit, and a third switching circuit, respectively; a fourth switching circuit that connects the first capacitor and the second capacitor with each other; a fifth switching circuit that connects the second capacitor and the third capacitor with each other; a reference voltage generation circuit that generates a first reference voltage, a second reference voltage, and a third reference voltage for the first capacitor, the second capacitor, and the third capacitor, respectively, and that applies the first reference voltage, the second reference voltage, and the third reference voltage to one terminal of each of the first capacitor, the second capacitor, and the third capacitor, respectively; a comparator that determines magnitude relationship between the analog input voltage and the first reference voltage, the second reference voltage, and the third reference voltage by comparing a voltage at another terminal of each of the first capacitor, the second capacitor, and the third capacitor with a predetermined value; a more significant bit conversion controller that, for M (M is an integer greater than or equal to 1) most significant bits, before the analog-to-digital converted value at Nth most significant bit is determined (N is an integer that is greater than or equal to 1 and smaller than or equal to M) with the fourth and the fifth switching circuits turned off, controls the reference voltage generation circuit to apply two reference voltages that are possibly referred to for obtaining the analog-to-digital converted value at the (N+1)th most significant bit to one terminal of each of two of the first capacitor, the second capacitor, and the third capacitor, and that controls the comparator to determine the analog-to-digital converted value at the (N+1)th most significant bit by controlling the comparator to compare a voltage at another terminal of one of the first capacitor, the second capacitor, and the third capacitor whose one terminal is applied with the reference voltage according to the analog-to-digital converted value at the Nth most significant bit with a predetermined value, after the analog-to-digital converted value at the Nth most significant bit is determined; and a less significant bit conversion controller that, for the (M+1)th most significant bit or the bits less significant, controls the reference voltage generation circuit to apply a reference voltage that is referred to for obtaining the analog-to-digital converted value at a Kth (K is an integer that is larger than or equal to (M+1)) most significant bit to one terminal of each of the first capacitor, the second capacitor, and the third capacitor with the one terminal of each of the first capacitor, the second capacitor, and the third capacitor connected with each other by turning on the fourth switching circuit and the fifth switching circuit, and controls the comparator to determine the analog-to-digital converted value at a Kth most significant bit by controlling the comparator to compare a voltage at the another terminal of each of the first capacitor, the second capacitor, and the third capacitor whose one terminal is applied with the reference voltage with a predetermined value.

An analog-to-digital converter according to an embodiment of the present invention comprises: a first capacitor, a second capacitor, and a third capacitor that each sample an analog input voltage in cooperation with a first switching circuit, a second switching circuit, and a third switching circuit, respectively; a reference voltage generation circuit that generates a first reference voltage, a second reference voltage, and a third reference voltage, for the first capacitor, the second capacitor, and the third capacitor, respectively, and that applies the first reference voltage, the second reference voltage, and the third reference voltage to one terminal of each of the first capacitor, the second capacitor, and the third capacitor, respectively; a comparator that determines magnitude relationship between the analog input voltage and the first reference voltage, the second reference voltage, and the third reference voltage by comparing a voltage at another terminal of each of the first capacitor, the second capacitor, and the third capacitor with a predetermined value; and a control circuit that performs charging operation for current comparison during previous comparison or charging operation by controlling timings at which the reference voltages generated by the reference voltage generation circuit are applied to the first capacitor, the second capacitor, and the third capacitor.

BRIEF DESCRIPTION OF THE DRAWINGS

FIG. 3 is a schematic for explaining timings of charging operation of stray capacitance of each of capacitors C1 to C3 shown in FIG. 1 and comparison thereof according to a second embodiment of the present invention;

FIG. 5 is a schematic for explaining timings of charging operation of stray capacitance of the capacitors C1 to C3 shown in FIG. 1 and comparison thereof according to a third embodiment of the present invention;

FIG. 9 is a schematic for explaining timings of charging operation of stray capacitance of each of the capacitors C1 to C3 shown in FIG. 7 and comparison thereof according to a sixth embodiment of the present invention;

DETAILED DESCRIPTION OF THE INVENTION

Exemplary embodiments of an A/D converter according to the present invention are described below with reference to the accompanying drawings.

First Embodiment

Figure 1:
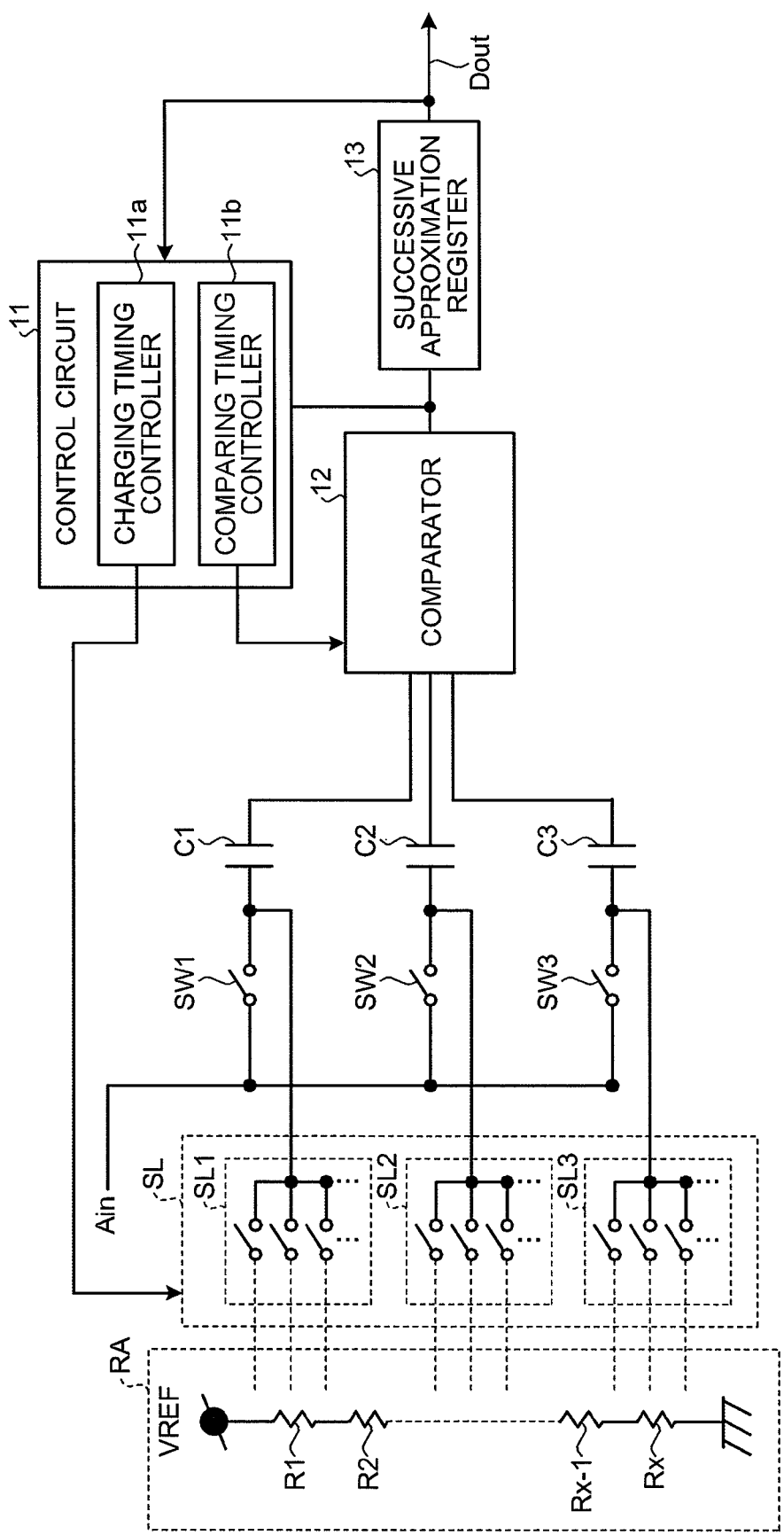
FIG. 1 is a schematic of an A/D converter according to a first embodiment of the present invention.

FIG. 1 is a schematic of an A/D converter according to a first embodiment of the present invention.

In FIG. 1, the A/D converter includes a series resistor RA, a switching unit SL, switching circuits SW1 to SW3, capacitors C1 to C3, a control circuit 11, a comparator 12, and a successive approximation register 13. The series resistor RA and the switching unit SL can be used as a reference voltage generation circuit that inputs a first reference voltage, a second reference voltage, and a third reference voltage in the capacitors C1 to C3, respectively.

The series resistor RA includes resistors R1 to Rx and can divide a reference voltage VREF, thereby generating a plurality of divided voltages. If A/D conversion is performed in a bit width of n, $2^n$ pieces of resistors R1 to Rx can be serially connected. Then, $2^n$ pieces of divided voltages can be taken from one terminal of each of the resistors R1 to Rx, each decrementing the standard voltage VREF by $\frac{1}{2}^n$ subtracted by the standard voltage VREF successively.

The switching unit SL includes switching units SL1 to SL3 each associated with the capacitors C1 to C3, respectively. The switching units SL1 to SL3 can input divided voltages generated by the series resistor RA in one terminal of each of the capacitors C1 to C3 as a first reference voltage, a second reference voltage, and a third reference voltage, respectively. If A/D conversion is performed in n bits, each of the switching units SL1 to SL3 can include $2^n$ pieces of switching devices. When charging operation of stray capacitance of the capacitors C1 to C3 is performed, each of the switching units SL1 to SL3 turns on one of the $2^n$ pieces of the switching devices and thus, can take a divided voltage from one terminal of one of the resistors R1 to Rx. Thus, each of the switching units SL1 to SL3 can input a divided voltage in one terminal of each of the capacitors C1 to C3.

Each of the switching circuits SW1 to SW3 can sample an analog input voltage Ain and input the analog input voltage Ain thus sampled thereby in one terminal of each of the capacitors C1 to C3, respectively. The capacitors C1 to C3 can hold the analog input voltages Ain thus sampled by the switching circuits SW1 to SW3, respectively. The comparator 12 compares the voltage at the other terminal of each of the capacitors C1 to C3 with a predetermined value, and thus, can determine magnitude relationship between the analog input voltage Ain and the first reference voltage, the second reference voltage, and the third reference voltage. The successive approximation register 13 can hold the output from the comparator 12 and can output an A/D converted value Dout.

The control circuit 11 can specify which switching device should be turned on in each of the switching units SL1 to SL3 during a charging period of stray capacitance of each of the capacitors C1 to C3, as well as can specify which capacitor should be selected from the capacitors C1 to C3 during a comparing period by the comparator 12. The control circuit 11 selects at least two switch units from the switching units SL1 to SL3 and simultaneously turns on one of the switching device of each of the switch units thus selected thereby, during the period in which charging operation of stray capacitance for each of the capacitors C1 to C3, and can select for a comparison one of the capacitors C1 to C3 and then, can select for the next charging operation one of the capacitors C1 to C3 not selected, during a period in which comparison is performed by the comparator 12.

Thus, the control circuit 11 includes a charging timing controller $11a$ and a comparing timing controller $11b$. The charging timing controller $11a$ can control the switching unit SL to apply each of the two reference voltages that may be referred to for determining the A/D converted value Dout at the (N+1)th most significant bit to one terminal of each of two of the capacitors C1 to C3, respectively before the A/D converted value Dout at the Nth most significant bit is determined, where N is an integer greater than or equal to 1. After the A/D converted value Dout at the Nth most significant bit is determined, the comparing timing controller 11b controls the comparator 12 to compare a voltage at the other terminal of one of the capacitors C1 to C3 whose one terminal is applied with a reference voltage according to the A/D converted value Dout at the Nth. most significant bit with a predetermined value. Thus, the comparing timing controller 11b can controls the comparator 12 to determine the A/D converted value Dout in the (N+1)th most significant bit.

During a sampling period, the switching circuits SW1 to SW3 are turned on, and an analog input voltage Ain is held in each of the capacitors C1 to C3. When the analog input voltage Ain is held in each of the capacitors C1 to C3, the switching circuits SW1 to SW3 are turned off. The control circuit 11 selects at least two of the switching units SL1 to SL3 and simultaneously turns on one of the switching devices in each of the switching units thus selected thereby during the charging period of stray capacitance of the capacitors C1 to C3. Thus, the control circuit 11 can control the switching unit SL to apply at least two of the first reference voltage, the second reference voltage, and the third reference voltage to one terminal of each of at least two of the capacitors C1 to C3, respectively.

During the comparing period by the comparator 12, the control circuit 11 controls the switching unit SL to select one of the capacitors C1 to C3 in a comparison, and controls the comparator 12 to determine magnitude relationship between the analog input voltage Ain and one of the first reference voltage, the second reference voltage, and the third reference voltage, thereby controlling the comparator 12 to determine the A/D converted value Dout at the Nth most significant bit. For next comparison, the control circuit 11 controls the switching unit SL to select one of the capacitors C1 to C3 not selected previously thereby, and controls the comparator 12 to determine magnitude relationship between the analog input voltage Ain and one of the two reference voltages not selected previously thereby, thereby controlling the comparator 12 to determine the A/D converted value Dout in the (N+1)th most significant bit.

If a bit width of the A/D converted value Dout is n bits, two reference voltages Va and Vb that may be referred to for obtaining the A/D converted value Dout at the (N+1)th most significant bit can be represented as follows.

$$(2^N \pm 2^{(N-1)} \pm \ldots \pm 2^0) \cdot VREF/2^{N+1}$$

In the formula, +is selected in the terms prior to ±2⁰ in the numerator if the A/D converted value Dout at the Nth most significant bit is 1, and—is selected therein if the A/D converted value Dout at the Nth most significant bit is 0.

A reference voltage Vc that is referred to for obtaining the A/D converted value at the Nth most significant bit can be represented as follows.

$$(2^N \pm 2^{(N-1)} \pm \ldots \pm 2^1) \cdot VREF/2^{N+1}$$

In the formula, + is selected in the terms in the numerator if the A/D converted value Dout at the (N−1)th most significant bit is 1, and − is selected therein if the A/D converted value Dout at the (N−1)th most significant bit is 0.

If the reference voltage during the comparison for the Nth most significant bit is Vc, the two reference voltages Va and Vb that may be referred to during the comparison for the (N+1)th most significant bit can be represented as follows.

$$Vc \pm VREF/2^{N+1}$$

If the A/D converted value Dout at the Nth most significant bit is 1, the value $Vc+VREF/2^{N+1}$ can be selected as the reference voltage Va at the (N+1)th most significant bit, and if the A/D converted value Dout at the Nth most significant bit is 0, the value $Vc-VREF/2^{N+1}$ can be selected as the reference voltage Vb at the (N+1)th most significant bit.

Figure 2:
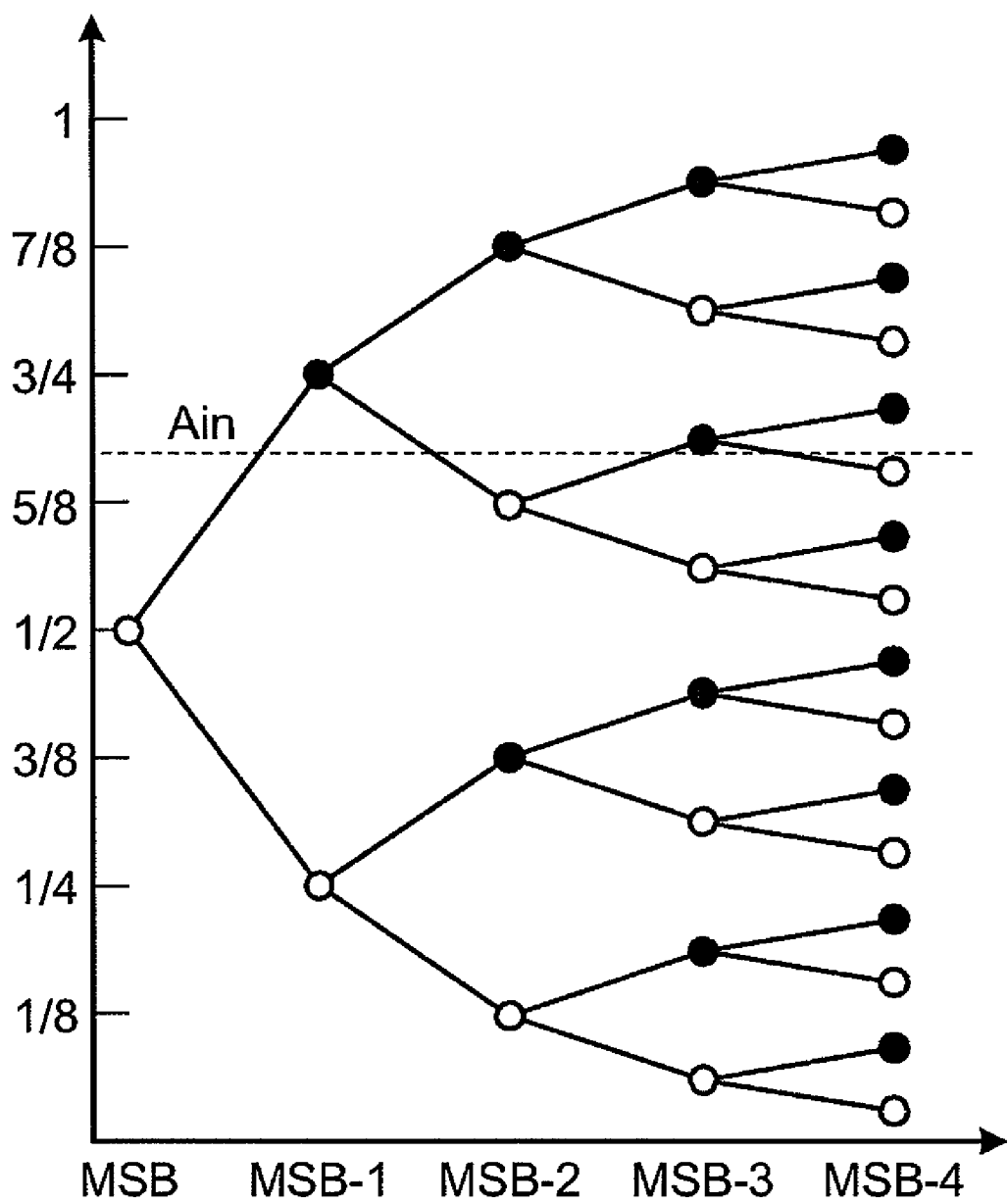
FIG. 2 is schematic of transition condition of a reference voltage VREF in the A/D converter shown in FIG. 1.

FIG. 2 is a schematic of transition condition of the standard voltage VREF in the A/D converter shown in FIG. 1.

In FIG. 2, it is assumed that the analog input voltage Ain is, for example, 41/64·VREF. To obtain the A/D converted value Dout at the most significant bit, the reference voltage of ½·VREF is applied to one terminal of one of the capacitors C1 to C3 in FIG. 1, and each of the reference voltages of ¼·VREF and ¾·VREF are applied to one terminal of each of the two of the capacitors C1 to C3.

If the analog input voltage Ain of 41/64VREF is determined to be higher than the ½·VREF as the result of comparing the analog input voltage Ain of 41/64VREF with ½·VREF, the A/D converted value Dout at the most significant bit is output as 1. If the A/D converted value Dout at the most significant bit is output as 1, one of the capacitors C1 to C3 whose one terminal is applied with a reference voltage of ¾·VREF is selected, and the analog input voltage Ain of 41/64VREF is compared with ¾·VREF. If the analog input voltage Ain of 41/64·VREF is determined to be lower than ¾·VREF as the result of comparing the analog input voltage Ain of 41/64VREF with ¾·VREF, the A/D converted value Dout at the second most significant bit is output as 0.

Similarly, because two most significant bits are "10 . . . ", the analog input voltage Ain of 41/64VREF is compared with ⅝·VREF to obtain the A/D converted value at the third most significant bit. If the analog input voltage Ain of 41/64VREF is determined to be higher than ⅝·VREF, the A/D converted value Dout at the third most significant bit is output as 1. Because three most significant bits are "101 . . . ", the analog input voltage Ain of 41/64VREF is compared with 11/16·VREF to obtain the A/D converted value at the fourth most significant bit. If the analog input voltage Ain of 41/64VREF is determined to be lower than 11/16·VREF, the A/D converted value Dout at the fourth most significant bit is output as 0. Because four most significant bits are "1010 . . . ", the analog input voltage Ain of 41/64VREF is compared with 21/32·VREF to obtain the A/D converted value at the fifth most significant bit. If the analog input voltage Ain of 41/64VREF is determined to be lower than 21/32·VREF, the A/D converted value Dout at the fifth most significant bit is output as 0.

Thus, charging operation for current comparison can be performed during the previous comparing or charging operation. Therefore, even if only one comparator 12 is provided in the A/D converter, charging operation of stray capacitance of the capacitors C1 to C3 and comparison thereof are not required to be performed successively each time A/D conversion for each bit is performed. As a result, A/D conversion process employing successive approximation can be accelerated while power consumption and circuit area required therefor are reduced.

Second Embodiment

In a second embodiment of the present invention, the control circuit 11 can simultaneously perform charging operation of stray capacitance of two of the capacitors C1 to C3 and comparison with respect to the capacitor other than the two capacitors. More specifically, while each of the two reference voltages that may be referred to for obtaining the A/D converted value Dout at the (N+1)th most significant bit is applied to one terminal of each of two of the capacitors C1 to C3, the comparing timing controller 11b compares the voltage at the other terminal of the capacitor other than the two capacitors with a predetermined value, thereby calculating the A/D converted value Dout at the Nth most significant bit.

FIG. 3 is a schematic for explaining timings of charging operation of stray capacitance of each of the capacitors C1 to C3 shown in FIG. 1 and comparison thereof according to the second embodiment of the present invention.

In FIG. 3, it is assumed that the analog input voltage Ain is, for example, $^{41}/_{64}$VREF. When the analog input voltage Ain of $^{41}/_{64}$VREF is A/D converted, the switching circuits SW1 to SW3 are turned on. Thus, the analog input voltage Ain of $^{41}/_{64}$VREF can be sampled in each of the capacitors C1 to C3, respectively. When the analog input voltage Ain of $^{41}/_{64}$VREF is sampled in each of the capacitors C1 to C3, the switching circuits SW1 to SW3 are turned off.

To obtain the A/D converted value Dout at the most significant bit, the control circuit 11 controls the switching units SL1 to SL3, thereby controlling the switching unit SL1 to SL3 to apply the reference voltage of ½·VREF to one terminal of one of the capacitors C1 to C3 shown in FIG. 1 and the reference voltages of ½·VREF±½$^2$·VREF that is ¼·VREF and 3/4·VREF are applied to one terminal of each of the two capacitors other than the capacitor to which the reference voltage of ½·VREF is applied.

Then, the control circuit 11 controls the switching unit SL1 to SL3 to select the capacitor to which the reference voltage of ½·VREF is applied to the terminal, and instructs the comparator 12 to compare the reference voltage Ain of $^{41}/_{64}$VREF with ½·VREF. If the comparator 12 determines that the analog input voltage Ain of $^{41}/_{64}$VREF is higher than ½·VREF as the result of comparing the analog input voltage Ain of $^{41}/_{64}$VREF with ½·VREF, the comparator 12 outputs 1 as the A/D converted value at the most significant bit that is Dout(MSB). When 1 is output as the A/D converted value Dout at the most significant bit, 1 is held in the successive approximation register 13 as the A/D converted value Dout at the most significant bit and then, is output to the control circuit 11.

When 1 is output to the control circuit 11 as the A/D converted value Dout at the most significant bit, the control circuit 11 controls the switching unit SL1 to SL3 to select the capacitor whose one terminal is applied with the reference voltage of ¾·VREF among the capacitors C1 to C3, and instructs the comparator 12 to compare the analog input voltage Ain of $^{41}/_{64}$VREF with ¾·VREF.

If the comparator 12 determines that the analog input voltage Ain of $^{41}/_{64}$VREF is lower than ¾·VREF as the result of comparing the analog input voltage Ain of $^{41}/_{64}$VREF with ¾·VREF, the comparator 12 outputs 0 as the A/D converted value at the second most significant bit that is Dout (MSB-1). When 0 is output as the A/D converted value Dout at the second most significant bit, 0 is held in the successive approximation register 13 as the A/D converted value Dout at the second most significant bit and then, is output to the control circuit 11.

While the comparator 12 compares the analog input voltage Ain of $^{41}/_{64}$VREF with ¾·VREF, the control circuit 11 controls the switching units SL1 to SL3, and thus, the control circuit 11 controls the switching unit SL1 to SL3 to apply the reference voltages of ¾·VREF±½$^3$·VREF that is ⅝·VREF and ⅞·VREF to one terminal of each of the two capacitors among the capacitors C1 to C3 other than the capacitor whose one terminal is applied with the reference voltage of ¾·VREF.

When 0 is output to the control circuit 11 as the A/D converted value Dout at the second most significant bit, the control circuit 11 controls the switching unit SL1 to SL3 to select the capacitor whose one terminal is applied with the reference voltage of ⅝·VREF among the capacitors C1 to C3, and instructs the comparator 12 to compare the analog input voltage Ain of $^{41}/_{64}$VREF with ⅝·VREF.

If the comparator 12 determines that the analog input voltage Ain of $^{41}/_{64}$VREF is higher than ⅝·VREF as the result of comparing the analog input voltage Ain of $^{41}/_{64}$VREF with ⅝·VREF, the comparator 12 outputs 1 as the A/D converted value at the third most significant bit that is Dout (MSB-2). When 1 is output as the A/D converted value Dout at the third most significant bit, 1 is held in the successive approximation register 13 as the A/D converted value Dout at the third most significant bit and then, is output to the control circuit 11.

While the comparator 12 compares the analog input voltage Ain of $^{41}/_{64}$VREF with ⅝·VREF, the control circuit 11 controls the switching units SL1 to SL3, and thus, the control circuit 11 controls the switching unit SL1 to SL3 to apply the reference voltage of ⅝·VREF±½$^4$·VREF that is $^9/_{16}$·VREF and $^{11}/_{16}$·VREF to one terminal of each of the two capacitors among the capacitors C1 to C3 other than the capacitor whose one terminal is applied with the reference voltage of ⅝·VREF.

When 1 is output to the control circuit 11 as the A/D converted value Dout at the third most significant bit, the control circuit 11 controls the switching unit SL1 to SL3 to select the capacitor to which the reference voltage of $^{11}/_{16}$·VREF is applied to the terminal, and instructs the comparator 12 to compare the analog input voltage Ain of $^{41}/_{64}$VREF with $^{11}/_{16}$·VREF.

If the comparator 12 determines that the analog input voltage Ain of $^{41}/_{64}$VREF is lower than $^{11}/_{16}$·VREF as the result of comparing the analog input voltage Ain of $^{41}/_{64}$VREF with $^{11}/_{16}$·VREF, the comparator 12 outputs 0 as the A/D converted value at the fourth most significant bit that is Dout (MSB-3). When 0 is output as the A/D converted value Dout at the fourth most significant bit, 0 is held in the successive approximation register 13 as the A/D converted value Dout at the fourth most significant bit and then, is output to the control circuit 11.

While the comparator 12 compares the analog input voltage Ain of $^{41}/_{64}$VREF with $^{11}/_{16}$·VREF, the control circuit 11 controls the switching units SL1 to SL3, and thus, the control circuit 11 controls the switching unit SL1 to SL3 to apply the reference voltage of $^{11}/_{16}$·VREF±½$^5$·VREF that is $^{21}/_{32}$·VREF and $^{23}/_{32}$·VREF to one terminal of each of the two capacitors among the capacitors C1 to C3 other than the capacitor whose one terminal is applied with the reference voltage of $^{11}/_{16}$·VREF.

When 0 is output to the control circuit 11 as the A/D converted value Dout at the fourth most significant bit, the control circuit 11 controls the switching unit SL1 to SL3 to select the capacitor whose one terminal is applied with the reference voltage of $^{21}/_{32}$·VREF among the capacitors C1 to C3, and instructs the comparator 12 to compare the analog input voltage Ain of $^{41}/_{64}$VREF with $^{21}/_{32}$·VREF.

If the comparator 12 determines that the analog input voltage Ain of 41/64VREF is lower than $^{21}/_{32}$·VREF as the result of comparing the analog input voltage Ain of $^{41}/_{64}$VREF with $^{21}/_{32}$·VREF, the comparator 12 outputs 0 as the A/D converted value at the fifth most significant bit that is Dout (MSB-4). When 0 is output as the A/D converted value Dout at the fifth most significant bit, 0 is held in the successive approximation register 13 as the A/D converted value Dout at the fifth most significant bit, and then, is output to the control circuit 11.

While the comparator 12 compares the analog input voltage Ain of $^{41}/_{64}$VREF with $^{21}/_{32}$·VREF, the control circuit 11 controls the switching units SL1 to SL3, and thus, the control circuit 11 controls the switching unit SL1 to SL3 to apply the reference voltage of $^{21}/_{32}$·VREF±½$^6$·VREF that is $^{41}/_{64}$·VREF and $^{43}/_{64}$·VREF to one terminal of each of the two capacitors among the capacitors C1 to C3 other than the capacitor whose one terminal is applied with the reference voltage of $21/32 \cdot \text{VREF}$.

Similarly in consecutive operations, while the control circuit 11 controls the switching unit SL1 to SL3 to apply reference voltages to one terminal of each of two capacitors among the capacitors C1 to C3, the control circuit 11 controls the comparator 12 to perform comparison with respect to the other terminal of the capacitor among the capacitors C1 to C3 other than the two capacitors whose one terminal is applied with the reference voltage. Thus, charging operation for a current comparison can be performed in the previous comparison. As a result, A/D conversion process employing successive approximation can be accelerated.

Figure 4:
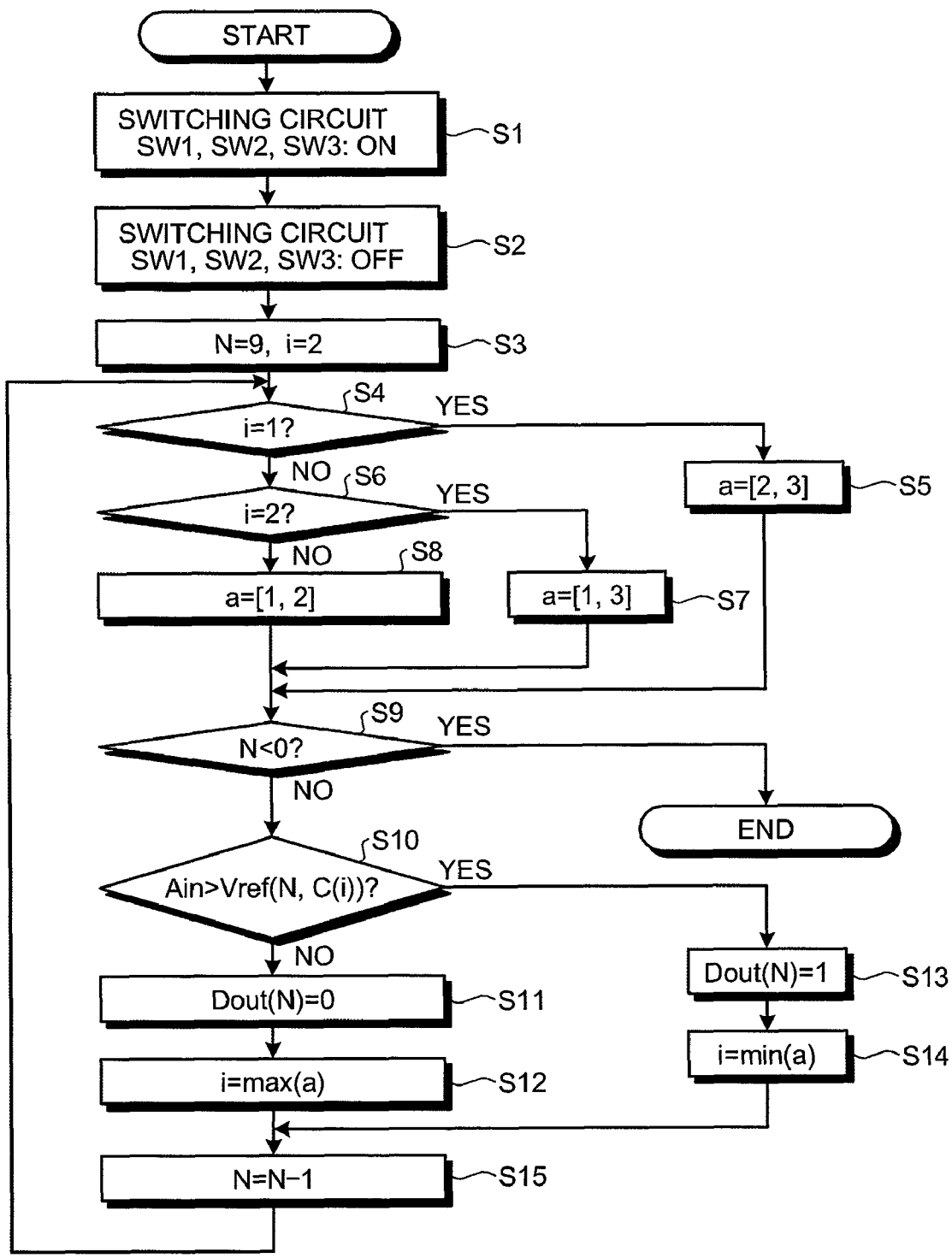
FIG. 4 is a flowchart of A/D conversion operation according to the second embodiment of the present invention.

FIG. 4 is a flowchart of A/D conversion operation according to the second embodiment of the present invention. In the example shown in FIG. 4, it is assumed that a bit width n of A/D conversion is 10 (LSB=0 ... MSB=9). Dout(N) indicates the A/D converted value Dout at the Nth most significant bit, C(i)(i=1,2,3) indicates capacitor C1, C2, or C3, Vref(N,C(i)) indicates the reference voltage at the Nth most significant bit when the capacitor C(i) is used in comparison.

In FIG. 4, by turning on the switching circuits SW1 to SW3 (Step S1), an analog input voltage Ain is sampled in each of the capacitors C1 to C3, respectively, and then, the switching circuits SW1 to SW3 are turned off (Step S2).

N is set to be 9, and i is set to be 2 (Step S3). If i is 1 (Step S4), the matrix [2, 3] is set to be a (Step S5). If i is 2 (Step S6), the matrix [1, 3] is set to be a (Step S7). If i is 3, the matrix [1, 2] is set to be a (Step S8).

Whether the analog input voltage Ain is higher than the reference voltage at the Nth most significant bit when the capacitor C(i) is used in comparison is determined (Step S10). If the analog input voltage Ain is determined to be lower than or equal to the reference voltage at the Nth most significant bit when the capacitor C(i) is used for comparison, Dout(N) is set to be 0 (Step S11), and the element in the matrix a that is larger than the other is set to be i (Step S12).

On the other hand, if the analog input voltage Ain is determined to be higher than the reference voltage at the Nth most significant bit when the capacitor C(i) is used in comparison, Dout(N) is set to be 1 (Step S13), and the element in the matrix a that is smaller than the other is set to be i (Step S14). While N is decremented by 1 (Step S15), the operations following Step S4 are repeated until N becomes smaller than 0 (Step S9).

Third Embodiment

In a third embodiment of the present invention, the control circuit 11 simultaneously performs charging operation of stray capacitance of the capacitors C1 to C3. Then, the control circuit 11 controls the switching unit SL1 to SL3 to select one of the capacitors C1 to C3 and controls the comparator 12 to perform the first comparison. Following the first comparison, the control circuit 11 controls the switching unit SL1 to SL3 to select one of the two capacitors that are not selected by the switching unit SL1 to SL3 among the capacitors C1 to C3, and controls the comparator 12 to perform the second comparison.

The charging timing controller 11a can control the switching unit SL1 to SL3 to apply the reference voltage that is referred to for obtaining the A/D converted value Dout at the Nth most significant bit to one terminal of one of the capacitors C1 to C3, and simultaneously, can control the switching unit SL1 to SL3 to apply the two reference voltages that may be referred to for obtaining the A/D converted value Dout at the (N+1)th most significant bit to one terminal of each of the capacitors whose one terminal is not applied with the reference voltage to obtain the A/D converted value Dout at the Nth most significant bit. A reference voltage is applied to one terminal of each of the capacitors C1 to C3 to obtain the A/D converted value Dout at the Nth most significant bit, and the comparing timing controller 11b controls the comparator 12 to compare the voltage at the terminal other than the terminal to which the reference voltage is applied with a predetermined value, thereby calculating the A/D converted value Dout at the Nth most significant bit. Then, the comparing timing controller 11b controls the comparator 12 to compare the voltage at the other terminal of one of the capacitors C1 to C3 whose one terminal is applied with a reference voltage according to the A/D converted value Dout at the Nth most significant bit with a predetermined value. Thus, the comparing timing controller 11b can control the comparator 12 to determine the A/D converted value Dout at the (N+1)th most significant bit.

If the bit width of the A/D converted value Dout is n bits, a reference voltage Vc that is referred to for obtaining the A/D converted value at the Nth most significant bit can be represented as follows.

$$(2^N \pm 2^{(N-1)} \pm \ldots \pm 2^1)\text{VREF}/2^{N+1}$$

In the formula, + is selected in the terms in the numerator if the A/D converted value Dout at the (N−1)th most significant bit is 1, and — is selected therein if the A/D converted value Dout at the (N−1)th most significant bit is 0.

The reference voltages Va and Vb that may be referred to for obtaining the A/D converted value Dout at the (N+1)th most significant bit can be represented as follows.

$$\text{Vc} \pm \text{VREF}/2^{N+1}$$

FIG. 5 is a diagram for explaining timings of charging operation of stray capacitance of the capacitors C1 to C3 shown in FIG. 1 and comparison thereof according to the third embodiment of the present invention.

In FIG. 5, it is assumed that the analog input voltage Ain is, for example, $41/64 \text{VREF}$. When the analog input voltage Ain of $41/64 \text{VREF}$ is A/D converted, the switching circuits SW1 to SW3 in FIG. 1 are turned on. Thus, the analog input voltage Ain of $41/64 \text{VREF}$ can be sampled in each of the capacitors C1 to C3, respectively. When the analog input voltage Ain of $41/64 \text{VREF}$ is sampled in each of the capacitors C1 to C3, respectively, the switching circuits SW1 to SW3 are turned off.

To obtain the A/D converted value Dout at the most significant bit, the control circuit 11 controls the switching units SL1 to SL3, thereby applying the reference voltage of $\frac{1}{2} \text{VREF}$ to one terminal of one of the capacitors C1 to C3 and the reference voltages of $\frac{1}{2}\text{VREF} \pm \frac{1}{2}^2\text{VREF}$ that is $\frac{1}{4}\text{VREF}$ and $\frac{3}{4}\text{VREF}$ are applied to one terminal of each of the two capacitors other than the capacitor to which the reference voltage of $\frac{1}{2}\text{VREF}$ is applied.

Then, the control circuit 11 controlling the switching unit SL1 to SL3 to select the capacitor to which the reference voltage of $\frac{1}{2}\text{VREF}$ is applied to the terminal among the capacitors C1 to C3, and instructs the comparator 12 to compare the reference voltage Ain of $41/64\text{VREF}$ with $\frac{1}{2}\text{VREF}$. If the comparator 12 determines that the analog input voltage Ain of $41/64\text{VREF}$ is higher than $\frac{1}{2}\text{VREF}$ as the result of comparing the analog input voltage Ain of $41/64\text{VREF}$ with $\frac{1}{2}\text{VREF}$, the comparator 12 outputs 1 as the A/D converted value at the most significant bit that is Dout(MSB). When 1 is output as the A/D converted value Dout at the most significant bit, 1 is held in the successive approximation register 13 as the A/D converted value Dout at the most significant bit and then, is output to the control circuit 11.

When 1 is output to the control circuit 11 as the A/D converted value Dout at the most significant bit, the control circuit 11 controls the switching unit SL1 to SL3 to select the capacitor whose one terminal is applied with the reference voltage of $\frac{3}{4}$VREF among the capacitors C1 to C3, and instructs the comparator 12 to compare the analog input voltage Ain of $\frac{41}{64}$VREF with $\frac{3}{4}$VREF.

If the comparator 12 determines that the analog input voltage Ain of $\frac{41}{64}$VREF is lower than $\frac{3}{4}$VREF as the result of comparing the analog input voltage Ain of $\frac{41}{64}$VREF with $\frac{3}{4}$VREF, the comparator 12 outputs 0 as the A/D converted value at the second most significant bit that is Dout (MSB-1). When 0 is output as the A/D converted value Dout at the second most significant bit, 0 is held in the successive approximation register 13 as the A/D converted value Dout at the second most significant bit and then, is output to the control circuit 11.

To obtain the A/D converted value Dout at the third most significant bit, if 0 is output as the A/D converted value Dout at the second most significant bit, the control circuit 11 controls the switching unit SL1 to SL3 to select $\frac{5}{8}$VREF as the reference voltage at the third most significant bit. Then, the control circuit 11 controls the switching units SL1 to SL3, thereby applying the reference voltage of $\frac{5}{8}$VREF to one terminal of one of the capacitors C1 to C3, and the reference voltages of $\frac{5}{8}$VREF$\pm\frac{1}{2}^4$VREF that is $\frac{9}{16}$VREF and $\frac{11}{16}$VREF are applied to one terminal of each of the two capacitors other than the capacitor to which the reference voltage of $\frac{5}{8}$VREF is applied.

Then, the control circuit 11 controls the switching unit SL1 to SL3 to select the capacitor whose one terminal is applied with the reference voltage of $\frac{5}{8}$VREF among the capacitors C1 to C3, and instructs the comparator 12 to compare the analog input voltage Ain of $\frac{41}{64}$VREF with $\frac{5}{8}$VREF. If the comparator 12 determines that the analog input voltage Ain of $\frac{41}{64}$VREF is higher than $\frac{5}{8}$VREF as the result of comparing the analog input voltage Ain of $\frac{41}{64}$VREF with $\frac{5}{8}$VREF, the comparator 12 outputs 1 as the A/D converted value at the third most significant bit that is Dout(MSB-2). When 1 is output as the A/D converted value Dout at the third most significant bit, 1 is held in the successive approximation register 13 as the A/D converted value Dout at the third most significant bit and then, is output to the control circuit 11.

When 1 is output to the control circuit 11 as the A/D converted value Dout at the third most significant bit, the control circuit 11 controls the switching unit SL1 to SL3 to select the capacitor to which the reference voltage of $\frac{11}{16}$VREF is applied to the terminal among the capacitors C1 to C3, and instructs the comparator 12 to compare the analog input voltage Ain of $\frac{41}{64}$VREF with $\frac{11}{16}$VREF.

If the comparator 12 determines that the analog input voltage Ain of $\frac{41}{64}$VREF is lower than $\frac{11}{16}$VREF as the result of comparing the analog input voltage Ain of $\frac{41}{64}$VREF with $\frac{11}{16}$VREF, the comparator 12 outputs 0 as the A/D converted value at the fourth most significant bit that is Dout (MSB-3). When 0 is output as the A/D converted value Dout at the fourth most significant bit, 0 is held in the successive approximation register 13 as the A/D converted value Dout at the fourth most significant bit and then, is output to the control circuit 11.

To obtain the A/D converted value Dout at the fifth most significant bit, if 0 is output as the A/D converted value Dout at the fourth most significant bit, the control circuit 11 controls the switching unit SL1 to SL3 to select $\frac{21}{32}$VREF as the reference voltage at the fifth most significant bit. Then, the control circuit 11 controls the switching units SL1 to SL3, thereby applying the reference voltage of $\frac{21}{32}$VREF to one terminal of one of the capacitors C1 to C3 shown in FIG. 1, and the reference voltages of $\frac{21}{32}$VREF$\pm\frac{1}{2}^6$VREF that is $\frac{41}{64}$VREF and $\frac{43}{64}$VREF are applied to one terminal of each of the two capacitors other than the capacitor to which the reference voltage of $\frac{21}{32}$VREF is applied.

The control circuit 11 controls the switching unit SL1 to SL3 to select the capacitor whose one terminal is applied with the reference voltage of $\frac{21}{32}$VREF among the capacitors C1 to C3, and instructs the comparator 12 to compare the analog input voltage Ain of $\frac{41}{64}$VREF with $\frac{21}{32}$VREF. If the comparator 12 determines that the analog input voltage Ain of $\frac{41}{64}$VREF is lower than $\frac{21}{32}$VREF as the result of comparing the analog input voltage Ain of $\frac{41}{64}$VREF with $\frac{21}{32}$VREF, the comparator 12 outputs 0 as the A/D converted value at the fifth most significant bit that is Dout (MSB-4). When 0 is output as the A/D converted value Dout at the fifth most significant bit, 0 is held in the successive approximation register 13 as the A/D converted value Dout at the fifth most significant bit, and then, is output to the control circuit 11.

Similarly in consecutive operations, the control circuit 11 controls the switching unit SL1 to SL3 to apply the reference voltage to one terminal of each of the capacitors C1 to C3, and then, controls the comparator 12 successively to perform comparison for the current and next operations. Therefore charging operation for the next comparison can be performed while charging operation for the current comparison is performed. As a result, A/D conversion employing successive approximation can be accelerated.

Figure 6:
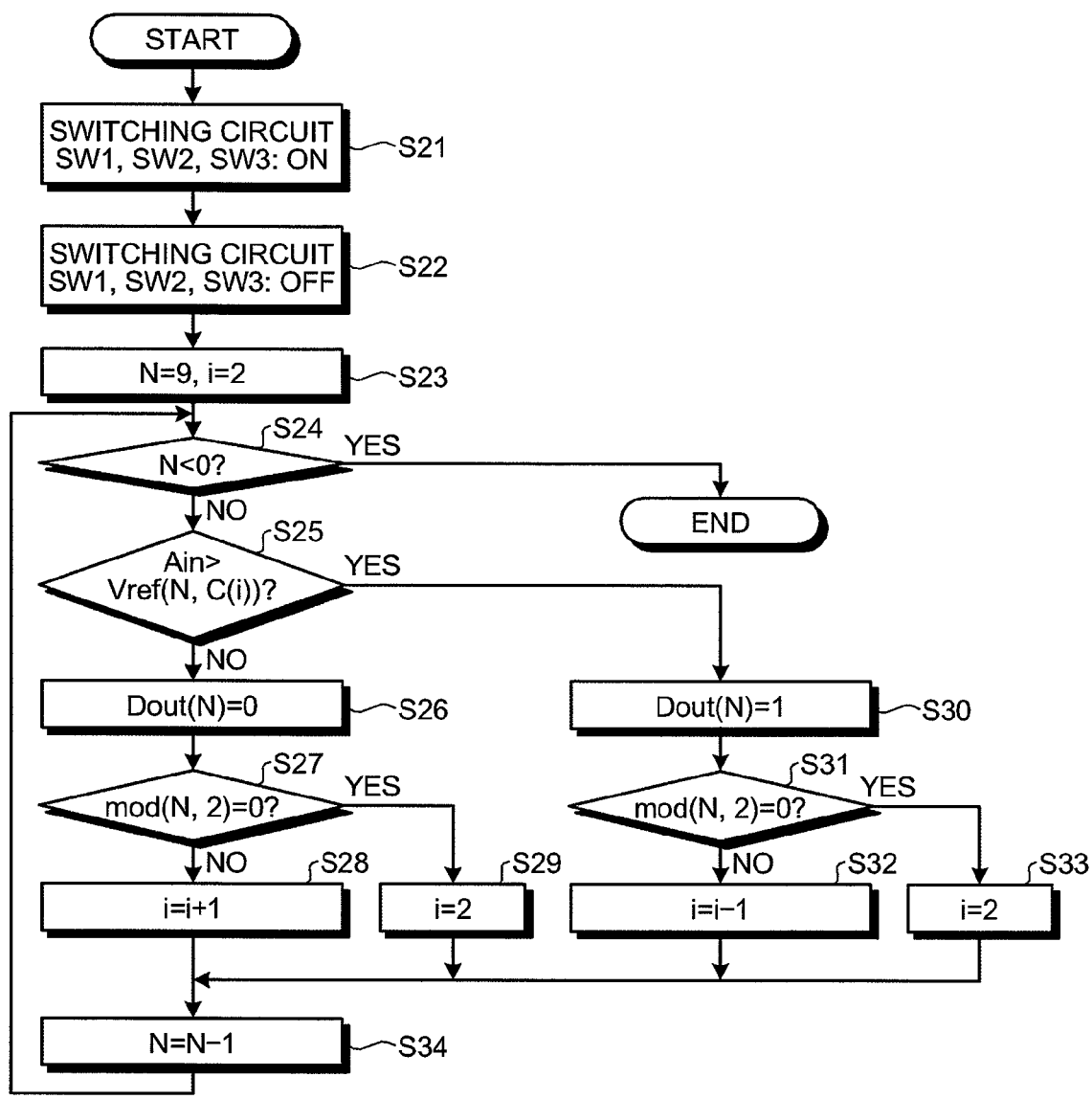
FIG. 6 is a flowchart of A/D conversion operation according to the third embodiment of the present invention.

FIG. 6 is a flowchart of A/D conversion operation according to the third embodiment of the present invention.

In FIG. 6, by turning on the switching circuits SW1 to SW3 (Step S21), an analog input voltage Ain is sampled in each of the capacitors C1 to C3, respectively, and then, the switching circuits SW1 to SW3 are turned off (Step S22).

N is set to be 9 and i is set to be 2 (Step S23), and whether the analog input voltage Ain is higher than the reference voltage at the Nth most significant bit when the capacitor C(i) is used in comparison is determined (Step S25). If the analog input voltage Ain is determined to be lower than or equal to the reference voltage at the Nth most significant bit when the capacitor C(i) is used in comparison, Dout(N) is set to be 0 (Step S26) and whether the reminder of N divided by 2 is 0 is determined (Step S27). If the reminder of N divided by 2 is not 0, i is incremented by 1 (Step S28), and if the reminder of N divided by 2 is 0, i is set to be 2 (Step S29).

On the other hand, if the analog input voltage Ain is determined to be higher than the reference voltage at the Nth most significant bit when the capacitor C(i) is used in comparison, Dout(N) is set to be 1 (Step S30), and whether the reminder of N divided by 2 is 0 is determined (Step S31). If the reminder of N divided by 2 is not 0, i is decremented by 1 (Step S32), and if the reminder of N divided by 2 is 0, i is set to be 2 (Step S33). While N is decremented by 1 (Step S34), the operations following Step S24 are repeated until N becomes smaller than 0 (Step S24).

Fourth Embodiment

Figure 7:
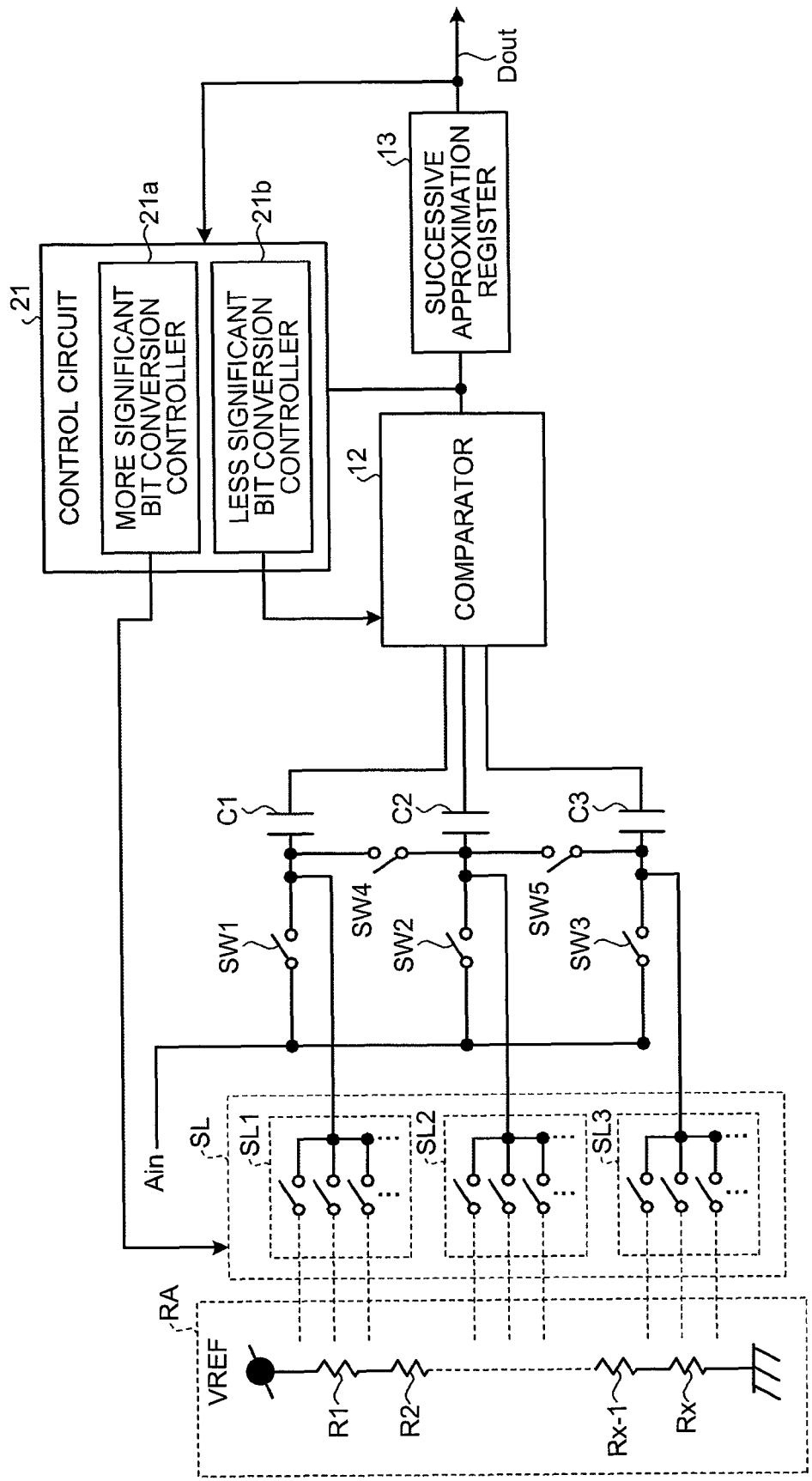
FIG. 7 is a schematic of an A/D converter according to a fourth embodiment of the present invention.

FIG. 7 is a schematic of an A/D converter according to a fourth embodiment of the present invention.

In FIG. 7, the A/D converter includes a switching circuits SW4 and SW5 in addition to the configuration shown in FIG. 1, and includes a control circuit 21 in place of the control circuit 11 shown in FIG. 1.

By turning on the switching circuit SW4, a terminal of the capacitors C1 is connected to a terminal of the capacitor C2. By turning on the switching circuit SW5, a terminal of the capacitor C2 is connected to a terminal of the capacitor C3.

The control circuit 21 can control the switching unit SL1 to SL3 to perform charging operation for the current comparison during the previous comparing or charging operation in A/D conversion for more significant bits, and can control the switching unit SL1 to SL3 and the comparator 12 to perform charging operation and comparison alternatively in each bit in A/D conversion for less significant bits.

The control circuit 21 includes a more significant bit conversion controller 21a and a less significant bit conversion controller 21b. For M (M is an integer greater than or equal to 1) most significant bits, the more significant bit conversion controller 21a can control the switching unit SL1 to SL3 to apply two reference voltages with the switching circuits SW4 and SW5 turned off that may be referred to for obtaining the A/D converted value at the (N+1)th. (N is an integer that is greater than or equal to 1 and smaller than or equal to M) most significant bit to two of the capacitors C1 to C3, before the A/D converted value at Nth most significant bit is determined. After the A/D converted value at the Nth most significant bit is determined, the reference voltage according to the A/D converted value at the Nth most significant bit is applied to one terminal of each of the capacitors C1 to C3. The more significant bit conversion controller 21a compares the voltage at the terminal, other than the terminal to which the reference voltage is applied, of one of the capacitors C1 to C3 with a predetermined value, thereby determining the A/D converted value at the (N+1)th most significant bit. For example, the more significant bit conversion controller 21a can control the switching unit SL1 to SL3 and the comparator 12 to perform charging operation and comparison according to the timings described in FIG. 3 or FIG. 5.

For the (M+1)th most significant bit or the bits less significant, the less significant bit conversion controller 21b turns on the switching circuits SW4 and SW5, thereby connecting the capacitors C1 to C3 in parallel. Then, the less significant bit conversion controller 21b controls the switching unit SL1 to SL3 to apply a reference voltage that may be referred to for obtaining the A/D converted value at the Kth. (K is an integer larger than or equal to the (M+1)) most significant bit to one terminal of one of the capacitors C1 to C3, and controls the comparator 12 to compare the voltages at each of the other terminals of the capacitors C1 to C3 with a predetermined value, thereby controlling the comparator 12 to determine the A/D converted value at the Kth most significant bit.

During a sampling period, the switching circuits SW1 to SW3 are turned on with the switching circuits SW4 and SW5 turned off, and thus, the analog input voltage Ain is held in the capacitors C1 to C3. When the analog input voltage Ain is held in each of the capacitors C1 to C3, the switching circuits SW1 to SW3 are turned off. For M most significant bits, the control circuit 21 selects at least two of the switching units SL1 to SL3 and simultaneously turns on one of the switching devices in each of the switch units thus selected thereby during the charging period of stray capacitance of the capacitors C1 to C3. Thus, the control circuit 21 can control the switching unit SL1 to SL3 to apply at least two of the first reference voltage, the second reference voltage, and the third reference voltage to one terminal of each of at least two of the capacitors C1 to C3, respectively.

During the comparing period, the control circuit 21 controls the switching unit SL1 to SL3 to select one of the capacitors C1 to C3 in a comparison, and controls the comparator 12 to determine magnitude relationship between the analog input voltage Ain and one of the first reference voltage, the second reference voltage, and the third reference voltage, thereby controlling the comparator 12 to determine the A/D converted value Dout at the Nth most significant bit. For in next comparison, the control circuit 11 controls the switching unit SL1 to SL3 to select one of the capacitors C1 to C3 not selected previously thereby, and controls the comparator 12 to determine magnitude relationship between the analog input voltage Ain and one of the two reference voltages not selected previously thereby, thereby controlling the comparator 12 to determine the A/D converted value Dout in the (N+1)th most significant bit.

For the (M+1)th most significant bit or the bits less significant, the control circuit 21 turns on the switching circuits SW4 and SW5, thereby connecting the capacitors C1 to C3 in parallel. During a charging period of stray capacitance of the capacitors C1 to C3, a reference voltage that is referred to for obtaining the A/D converted value at the Kth most significant bit is applied to one terminal of each of the capacitors C1 to C3. During a period in which comparison is performed by the comparator 12, the control circuit 21 controls the comparator 12 to compare the voltage at the terminals, other than the terminals to which the reference voltage is applied, of the capacitors C1 to C3 whose one terminal is applied with the reference voltage, with a predetermined value, thereby controlling the comparator 12 to determine the A/D converted value at the Kth most significant bit.

Thus, for the more significant bits, charging operation for the current comparison can be performed during the previous comparing or charging operation, and for the less significant bits, charge amount of the capacitor used for comparison can be increased to be three times as much as charging amount used for A/D conversion for more significant bits. Therefore, even if only one comparator 12 is provided in the A/D converter and A/D conversion operation employing successive approximation can be accelerated while conversion error in less significant bits due to effects of noise can be reduced.

To improve accuracy of A/D conversion, comparison having redundancy of X bits may be adapted in the A/D converter. Then, the portion in which comparison is performed with the redundancy can be adjusted by digital correction. If comparison with redundancy is adapted therein, comparison can be started before the reference voltage is completely applied to the capacitors C1 to C3.

Fifth Embodiment

Figure 8:
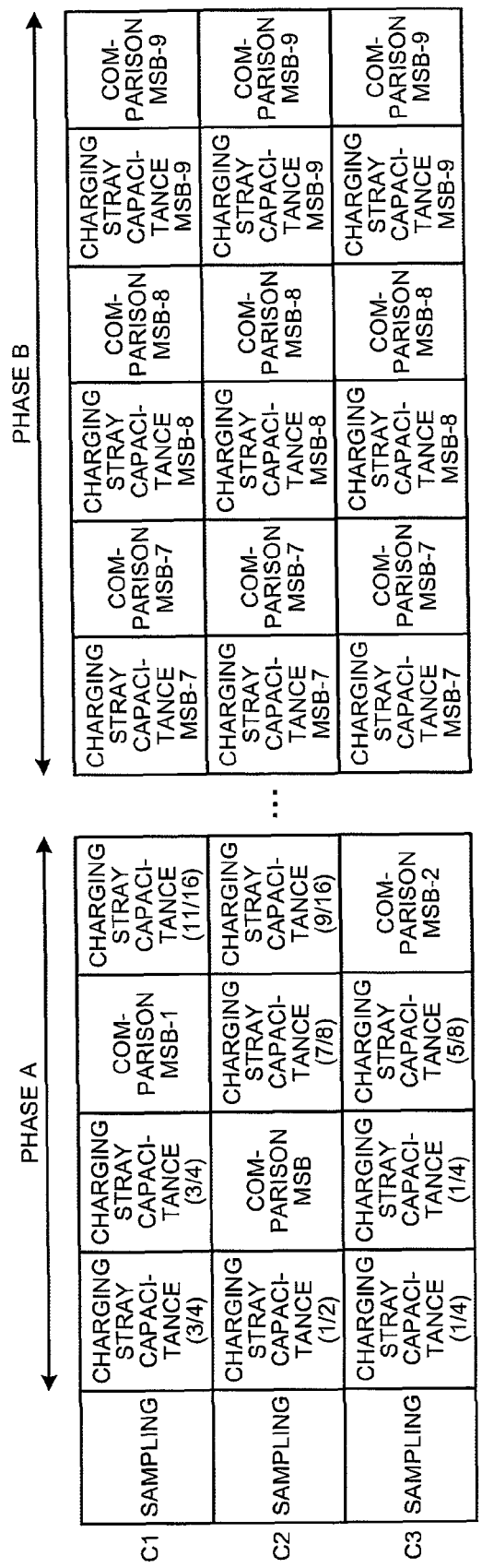
FIG. 8 is a schematic for explaining timings of charging operation of stray capacitance of each of the capacitors C1 to C3 shown in FIG. 7 and comparison thereof according to a fifth embodiment of the present invention.

FIG. 8 is a schematic for explaining timings of charging operation of stray capacitance of each of the capacitors C1 to C3 shown in FIG. 7 and comparison thereof according to a fifth embodiment of the present invention.

In FIG. 8, in a phase A, A/D conversion is performed in the same method shown in FIG. 3 for, for example, the seventh most significant bits. In a phase B, the control circuit 21 turns on the switching circuits SW4 and SW5, thereby connecting the capacitors C1 to C3 in parallel. To obtain the A/D converted value at the eighth most significant bit that is Dout (MSB-7), the control circuit 21 controls the switching units SL1 to SL3, thereby applying a reference voltage that is referred to for obtaining the eighth most significant bit to one terminal of each of the capacitors C1 to C3. When the reference voltage that is referred to for obtaining the A/D converted value at the eighth most significant bit is applied to the terminal of each of the capacitors C1 to C3, the control circuit 21 instructs the comparator 12 to compare the voltage at the terminal, other than the terminal to which the reference voltage is applied, of the capacitors C1 to C3 with a predetermined value, thereby determining the A/D converted value at the eighth most significant bit.

When the A/D converted value at the eighth most significant bit is determined, the control circuit 21 controls the switching units SL1 to SL3, thereby applying a reference voltage that is referred to for obtaining the A/D converted value at the ninth most significant bit to one terminal of each of the capacitors C1 to C3. When the reference voltage that is referred to for obtaining the A/D converted value at the ninth most significant bit is applied to the terminal of each of the capacitors C1 to C3, the control circuit 21 instructs the comparator 12 to compare the voltage at the terminal, other than the terminal to which the reference voltage is applied, of the capacitors C1 to C3, thereby determining the A/D converted value at the ninth most significant bit.

When the A/D converted value at the ninth most significant bit is determined, the control circuit 21 controls the switching units SL1 to SL3, thereby applying a reference voltage that is referred to for obtaining the A/D converted value at the tenth most significant bit to one terminal of the capacitors C1 to C3. When the reference voltage that is referred to for obtaining the tenth most significant bit is applied to the terminal of the capacitors C1 to C3, the control circuit 21 instructs the comparator 12 to compare the voltage at the terminal, other than the terminal to which the reference voltage is applied, of the capacitors C1 to C3 with a predetermined value, thereby determining the A/D converted value at the tenth most significant bit.

Sixth Embodiment

FIG. 9 is a schematic for explaining timings of charging operation of stray capacitance of each of the capacitors C1 to C3 shown in FIG. 7 and comparison thereof according to a sixth embodiment of the present invention.

In FIG. 9, in a phase A, A/D conversion is performed in the same method shown in FIG. 5 for, for example, the seventh most significant bits. In a phase B, for the eighth most significant bit or the bits less significant, A/D conversion is performed in the same method in the phase B shown in FIG. 8.

Figure 10:
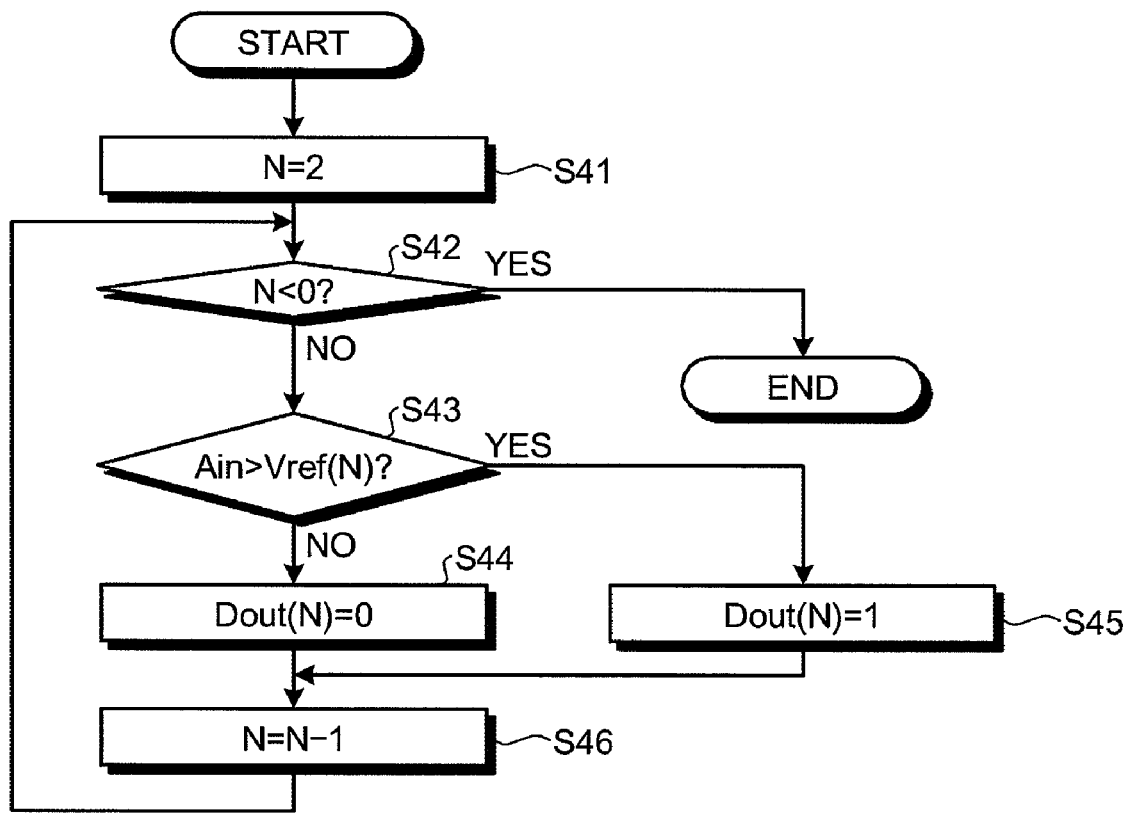
FIG. 10 is a flowchart of A/D conversion operation performed by a less significant bit conversion controller $21b$ shown in FIG. 7.

FIG. 10 is a flowchart of A/D conversion operation performed by a less significant bit conversion controller 21b shown in FIG. 7. In the example shown in FIG. 10, it is assumed that a bit width n of A/D conversion is 10 (LSB=0 ... MSB=9) and that the less significant bit conversion controller 21b performs A/D conversion for the eighth most significant bit or the bits less significant. Vref(N) indicates a reference voltage at the Nth most significant bit.

In FIG. 10, N is set to be 2 (Step S41). Whether the analog input voltage Ain is lower than or equal to the reference voltage at the Nth most significant bit is determined (Step S43). If the analog input voltage Ain is determined to be lower than or equal to the reference voltage at the Nth most significant bit, Dout(N) is set to be 0 (Step S44).

On the other hand, if the analog input voltage Ain is determined to be higher than the reference voltage at the Nth most significant bit, Dout(N) is set to be 1 (Step S45). While N is decremented by 1 (Step S46), the operations following Step S42 are repeated until the N becomes smaller than 0 (Step S42).

Seventh Embodiment

Figure 11:
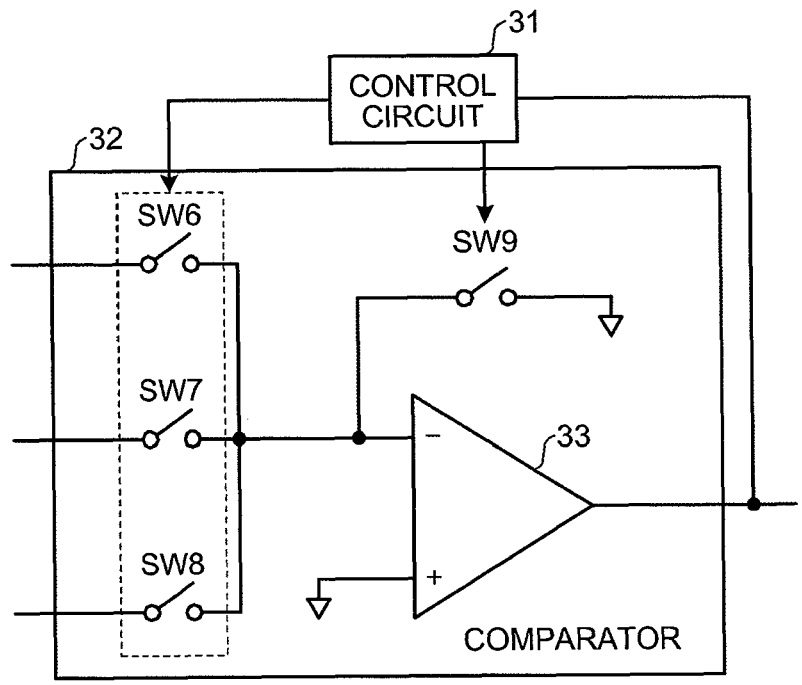
FIG. 11 is a schematic of a comparator used in an A/D converter according to a seventh embodiment of the present invention.

FIG. 11 is a schematic of a comparator used in an A/D converter according to a seventh embodiment of the present invention.

In FIG. 11, a comparator 32 includes an operational amplifier 33. The inverting input terminal of the operational amplifier 33 is connected to the other terminal of each of the capacitors C1 to C3 via switching circuits SW6 to SW8, and to a predetermined potential via a switching circuit SW9. The non-inverting input terminal of the operational amplifier 33 is connected to the predetermined voltage, and the output terminal of the operational amplifier 33 is connected to a control circuit 31.

When the analog input voltage Ain is sampled in each of the capacitors C1 to C3, the control circuit 31 turns on the switching circuits SW6 to SW9, thereby the other terminal of each of the capacitors C1 to C3 are connected to the predetermined voltage. Then, the control circuit 31 turns on the switching circuits SW1 to SW3, thereby the analog input voltage Ain is input to one terminal of each of the capacitors C1 to C3 and the analog input voltage Ain is held in each of the capacitors C1 to C3.

When the control circuit 31 instructs the comparator 32 to perform comparison, the control circuit 31 turns off the switching circuit SW9, and then, turns on one of the switching circuits SW6 to SW8 at each comparison. Thus, the voltage at the other terminal of the one of the capacitors C1 to C3 is input to the inverting input terminal of the operational amplifier 33.

In A/D conversion for less significant bits shown in FIG. 7, by turning on all the switching circuits SW6 to SW8, the voltage at the other terminal of each of the capacitors C1 to C3 can be input to the inverting input terminal of the operational amplifier 33.

Eighth Embodiment

Figure 12:
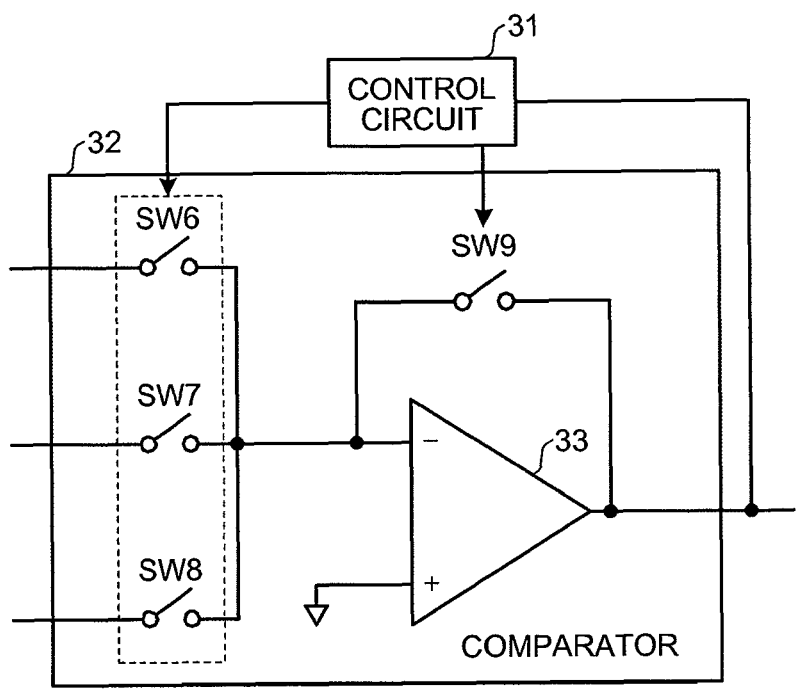
FIG. 12 is a schematic of a comparator used in an A/D converter according to an eighth embodiment of the present invention.

FIG. 12 is a schematic of a comparator used in an A/D converter according to an eighth embodiment of the present invention.

In FIG. 12, configuration of the A/D converter is the same as in FIG. 11 except that the inverting input terminal of the operational amplifier 33 is connected to the output terminal of the operational amplifier 33 via the switching circuit SW9. On/Off timing of the switching circuits SW6 to SW9 is the same as the configuration shown in FIG. 11.

When the analog input voltage Ain is held in each of the capacitors C1 to C3, the inverting input terminal of the operational amplifier 33 can be connected to the output terminal of the operational amplifier 33. Thus, input offset can be cancelled.

In A/D conversion for less significant bits shown in FIG. 7, the voltage at the other terminal of each of the capacitors C1 to C3 can be input to the inverting input terminal of the operational amplifier 33 by turning on all the switching circuits SW6 to SW8 for each comparison.

Ninth Embodiment

Figure 13:
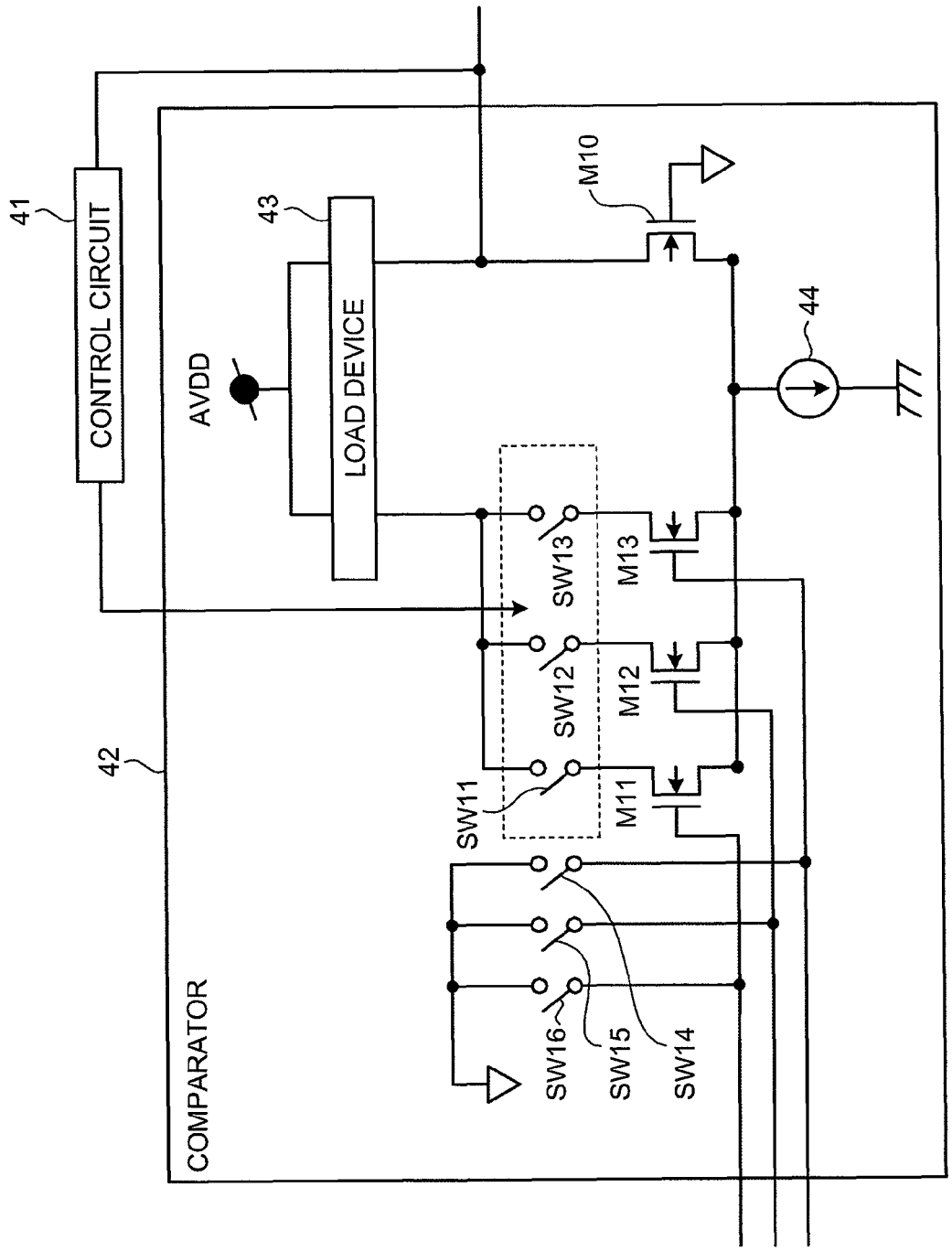
FIG. 13 is a schematic of a comparator used in an A/D converter according to a ninth embodiment of the present invention.

FIG. 13 is a schematic of a comparator used in an A/D converter according to a ninth embodiment of the present invention.

In FIG. 13, a comparator 42 includes field effect transistors (FETs) M10 to M13. The drain of the FET M10 is connected to the supply voltage AVDD via a load device 43, and to a control circuit 41. The drain of each of the FETs M11 to M13 is connected to the supply voltage AVDD via each of switching circuits SW11 to SW13, respectively and the load device 43. The source of each of the FET M10 to M13 is connected to the ground potential via a current source 44. The gate of the FET M10 is connected to a predetermined potential. The gate of each of the FET M11 to M13 is connected to the other terminal of each of the capacitors C1 to C3 shown in FIG. 1 or FIG. 7, and to the predetermined voltage via each of switching circuits SW14 to SW16, respectively. The load device 43 may consist of a device such as a resistor and a transistor.

When the analog input voltage Ain is sampled in each of the capacitors C1 to C3, the control circuit 41 turns on the switching circuits SW11 to SW16, thereby the other terminal of each of the capacitors C1 to C3 are connected to the predetermined voltage. Then, the control circuit 41 turns on the switching circuits SW1 to SW3, thereby he analog input voltage Ain is input to one terminal of each of the capacitors C1 to C3 and the analog input voltage Ain is held in each of the capacitors C1 to C3.

When the control circuit 41 instructs the comparator 42 to perform comparison, the control circuit 41 turns off the switching circuits SW14 to SW16, and then, turns on one of the switching circuits SW11 to SW13 at each comparison. Thus, the electric current according to the voltage at the other terminal of one of the capacitors C1 to C3 flows into each of the FETs M11 to M13, and thus, the difference between the electric current flowing in the FETs M11 to M13 and the electric current flowing in the FET M10 can be output.

By inputting the voltage at the other terminal of each of the capacitors C1 to C3 to the gate of each of the FETs M11 to M13, superimpose of switching noises generated by the switching circuits SW11 to SW13 over the voltage at the other terminal of each of the capacitors C1 to C3 can be reduced, and thus, degradation of A/D conversion accuracy can be reduced.

In A/D conversion for less significant bits shown in FIG. 7, by turning on all the switching circuits SW11 to SW13, the electric current according to the voltage at the other terminal of each of the capacitors C1 to C3 flows into each of the FETs M11 to M13, and thus, the difference between the electric current flowing in the FETs M11 to M13 and the electric current flowing in the FET M10 can be output.

Tenth Embodiment

Figure 14:
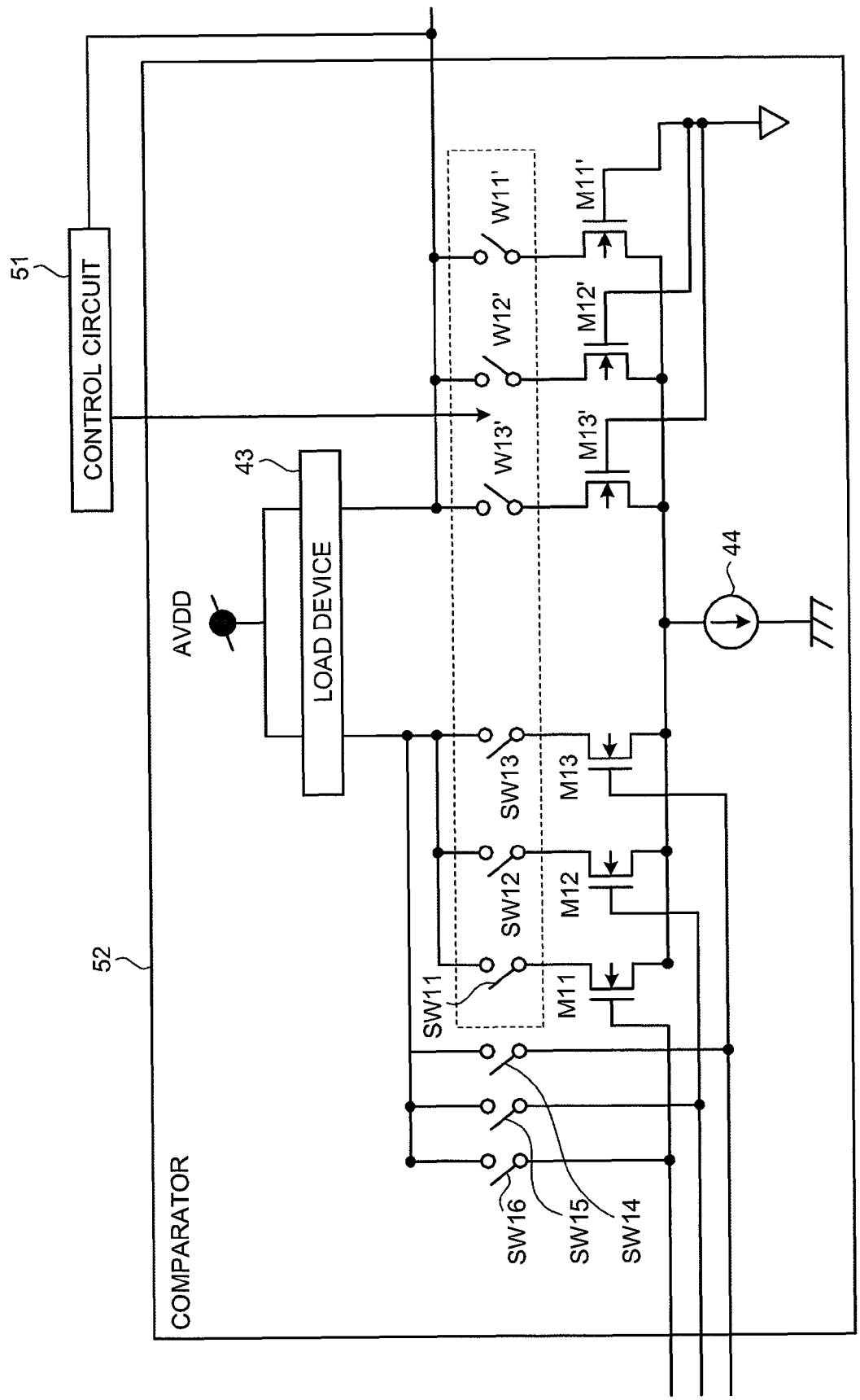
FIG. 14 is a schematic of a comparator used in an A/D converter according to a tenth embodiment of the present invention.

FIG. 14 is a schematic of a comparator used in an A/D converter according to a tenth embodiment of the present invention.

In FIG. 14, a comparator 52 includes FETs M11' to M13' and switching circuits SW11' to SW13' in place of the FET M10 in FIG. 13. The drain of each of the FETs M11' to M13' is connected to the supply voltage AVDD via each of the switching circuits SW11' to SW1' and the load device 43. The source of each of the FETs M11' to M13' is connected to the ground potential via the current source 44. The gate of each of the FETs M11' to M13' is connected to a predetermined potential.

When the analog input voltage Ain is sampled in each of the capacitors C1 to C3, a control circuit 51 turns on the switching circuits SW11 to SW16 and SW11' to SW13', thereby the other terminal of each of the capacitors C1 to C3 is connected to the predetermined voltage. Then, the control circuit 51 turns on the switching circuits SW1 to SW3, thereby the analog input voltage Ain is input to one terminal of each of the capacitors C1 to C3 and the analog input voltage Ain is held in each of the capacitors C1 to C3.

When the control circuit 51 instructs a comparator 52 to perform comparison, the control circuit 51 turns off the switching circuits SW14 to SW16, and then, turns on one of the switching circuits SW11 to SW13 in synchronization with one of the switching circuits SW11' to SW13'. Thus, the electric current according to the voltage at the other terminal of each of the capacitors C1 to C3 flows into the FETs M11 to M13, and into one of the FETs M11' to M13'. As a result, the difference between the electric current thereof and the electric current flowing in the one of the FETs M11' to M13' can be output.

When the analog input voltage Ain is sampled, input offset can be cancelled by employing an auto zero technology by which an inverting input and an output of the comparator 52 are connected to each other, as well as clock field through and charge injection due to switching circuits can be reduced by inputting the voltage at the other terminal of each of the capacitors C1 to C3 to the gate of each of the FETs M11 to M13. Thus, degradation of A/D conversion accuracy can be reduced.

In A/D conversion for less significant bits shown in FIG. 7, by turning on all the switching circuits SW11 to SW13 and SW11' to SW13', the electric current according to the voltage at the other terminal of each of the capacitors C1 to C3 flows into each of the FETs M11 to M13 as well as M11' to M13', and thus, the difference between the electric current flowing in the FETs M11 to M13 and the electric current flowing in the M11' to M13' can be output.

In the embodiments above, the series resistor RA and the switching unit SL are described as a reference voltage generation circuit that inputs a first reference voltage, a second reference voltage, and a third reference voltage to one terminal of each of the capacitors C1 to C3. Reference voltage generation circuits are, however, not limited thereto. Other configuration of a reference voltage generation circuit may also be employed.

Eleventh Embodiment

Figure 15:
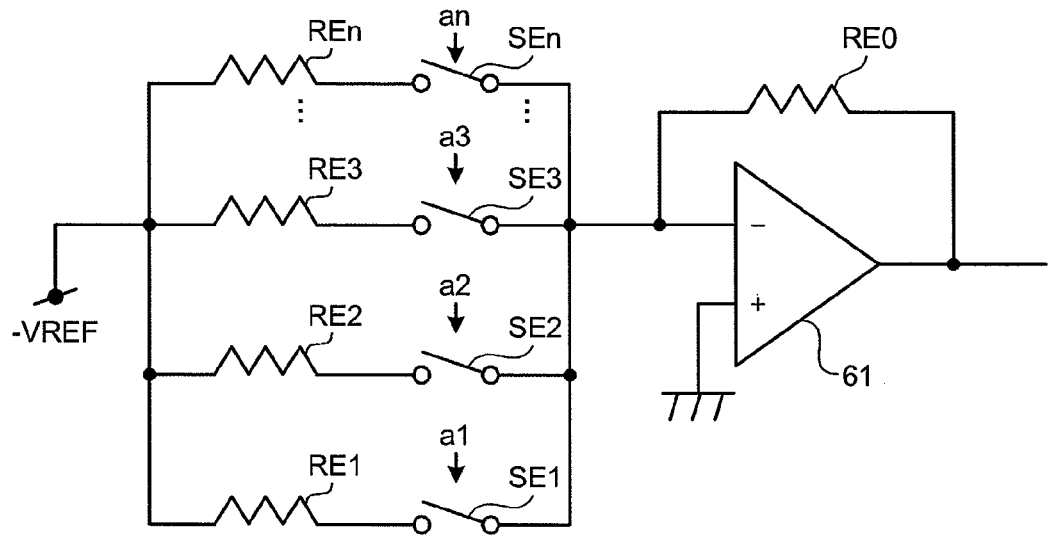
FIG. 15 is a schematic of a reference voltage generation circuit used in an A/D converter according to an eleventh embodiment of the present invention.

FIG. 15 is a schematic of a reference voltage generation circuit used in an A/D converter according to an eleventh embodiment of the present invention.

In FIG. 15, the inverting input terminal of an operational amplifier 61 is connected to resistors RE1 to REn via switching circuits SE1 to SEn, respectively, and to the output terminal of the operational amplifier 61 via a resistor RE0. The non-inverting input terminal of the operational amplifier 61 is connected to the ground potential.

Assuming the resistance value of the resistor RE1 to be R, the resistance value of the resistors RE2, RE3, . . . , REn can be set to be $2R, 2^2R, \ldots, 2(n-1)R$, respectively. Assuming a1, a2, a3, . . . , an to be the A/D converted values at the most, the second most, the third most, . . . , and the nth most significant bit, respectively, each of the switching circuits SE1 to SEn can be on/off controlled with each of the A/D converted values (a1, a2, a3, . . . , an). For example, if an is 1, the switching circuit SEn can be turned on, and if an is 0, the switching circuit SEn can be turned off.

By on/off controlling the switching circuits SE1 to SEn according to the A/D converted values (a1, a2, a3, . . . , an), analog voltage according to the A/D converted values (a1, a2, a3, . . . , an) can be output from the operational amplifier 61.

When the reference voltage generation circuit shown in FIG. 15 is employed as a reference voltage generation circuit that generates a first reference voltage, a second reference voltage, and a third reference voltage, the only three reference voltage generation circuits can be provided in the A/D converter with each associated with each of the capacitors C1 to C3 shown in FIG. 1 or FIG. 7.

When the series resistor RA and the switching unit SL is employed as a reference voltage generation circuit, $2^n$ pieces of resistors and $3 \times 2^n$ pieces of switching devices are required. On the other hand, only $3 \times (n+1)$ pieces of resistors and $3 \times n$ pieces of switching devices are required in the reference voltage generation circuit shown in FIG. 15. Therefore, if a bit width n of A/D conversion is larger, the number of resistors and switching devices required for a reference voltage generation circuit can be significantly reduced.

Twelfth Embodiment

Figure 16:
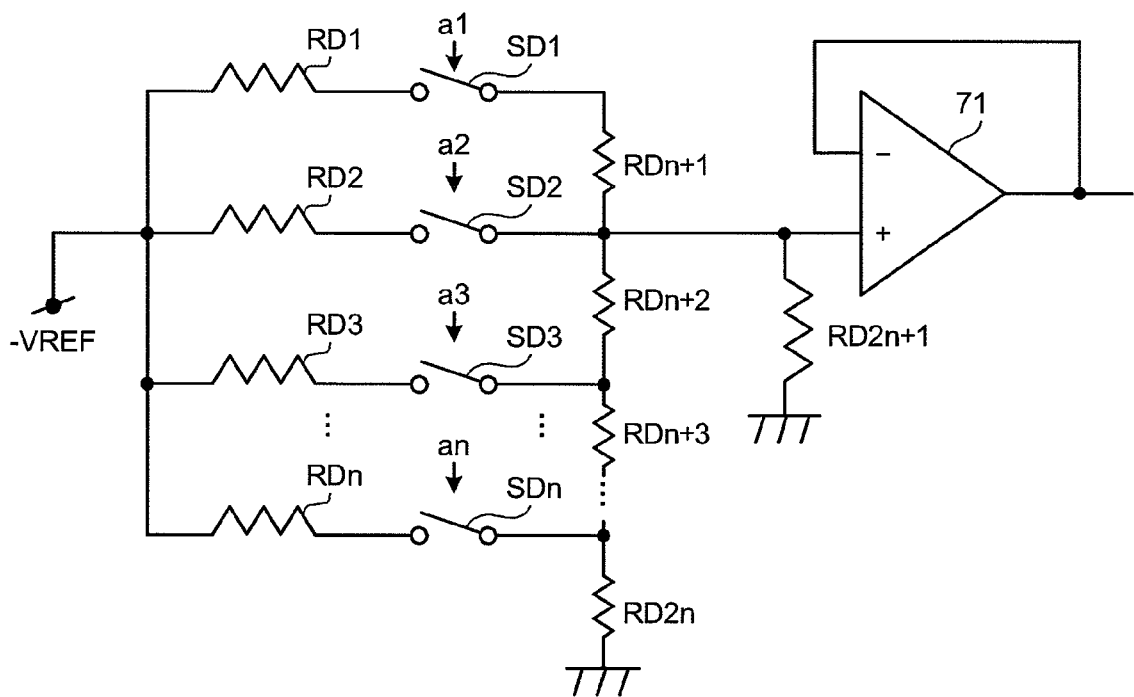
FIG. 16 is a schematic of a reference voltage generation circuit used in an A/D converter according to a twelfth embodiment of the present invention.

FIG. 16 is a schematic of a reference voltage generation circuit used in an A/D converter according to a twelfth embodiment of the present invention.

In FIG. 16, the non-inverting input terminal of an operational amplifier 71 is connected to the ground potential via resistors RDn+1, RDn+2, RDn+3, . . . , RD2n successively, and to the ground potential via resistor RD2n+1. The connection point of each of the resistors RD2n+1, RDn+1, RDn+2, RDn+3, . . . , RD2n is connected to each of resistors RD1 to RDn via each of switching circuits SD1 to SDn, respectively. The inverting input terminal of the operational amplifier 71 is connected to the output terminal of the operational amplifier 71. Assuming a resistance value of the resistor RD1 is 2R, the resistance value of the resistors RD2 to RDn, RD2n, RD2n+1 can be set to be 2R, and the resistance value of the resistors RDn+1 to RD2n−1 can be set to be R. Assuming a1, a2, a3, . . . , an to be the A/D converted values at the most, the second most, the third most, . . . , and the nth most significant bit, respectively, each of the switching circuits SD1 to SDn can be on/off controlled with each of the A/D converted values (a1, a2, a3, . . . , an).

By on/off controlling the switching circuits SD1 to SDn according to the A/D converted values (a1, a2, a3, . . . , an), analog voltage according to the A/D converted values (a1, a2, a3, . . . , an) can be output from the operational amplifier 71.

When the reference voltage generation circuit shown in FIG. 16 is employed as a reference voltage generation circuit that generates a first reference voltage, a second reference voltage, and a third reference voltage, the only three reference voltage generation circuits can be provided in the A/D converter with each associated with each of the capacitors C1 to C3 shown in FIG. 1 or FIG. 7.

When the series resistor RA and the switching unit SL is employed as a reference voltage generation circuit, $2^n$ pieces of resistors and $3 \times 2^n$ pieces of switching devices are required. On the other hand, only $3 \times (2n+1)$ pieces of resistors and $3 \times n$ pieces of switching devices are required in the reference voltage generation circuit shown in FIG. 16. Therefore, if a bit width n of A/D conversion is larger, the number of resistors and switching devices required for a reference voltage generation circuit can be significantly reduced, as well as only two types of resistors having resistance values R and 2R are required, and thus, reference voltages having excellent accuracy and temperature characteristics can be generated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog-to-digital converter comprising:

a first capacitor, a second capacitor, and a third capacitor each configured to sample an analog input voltage in cooperation with a first switching circuit, a second switching circuit, and a third switching circuit, respectively;

a reference voltage generator configured to generate a first reference voltage, a second reference voltage, and a third reference voltage for the first capacitor, the second capacitor, and the third capacitor, respectively, and to apply the first reference voltage, the second reference voltage, and the third reference voltage to first terminals of the first capacitor, the second capacitor, and the third capacitor, respectively;

a comparator between the analog input voltage and the first reference voltage, the second reference voltage, and the third reference voltage configured to compare a voltage at second terminals of the first capacitor, the second capacitor, and the third capacitor with a predetermined value;

a charging timing controller configured to control the reference voltage generator to apply two reference voltages in order to obtain an analog-to-digital converted value at an (N+1)th most significant bit to the first terminal of two of the first capacitor, the second capacitor, and the third capacitor before an analog-to-digital converted value at an Nth most significant bit is determined, where N is an integer that is larger than or equal to one; and a comparing timing controller configured to control the comparator to determine an analog-to-digital converted value at the (N+1)th most significant bit by controlling the comparator to compare a voltage at the second terminals of the first capacitor, the second capacitor, and the third capacitor with the first terminal applied with a reference voltage according to the analog-to-digital converted value at the Nth most significant bit with a predetermined value after the analog-to-digital converted value at the Nth most significant bit is determined.

2. The analog-to-digital converter of claim 1, wherein the comparing timing controller is configured to control the comparator to compare a voltage at the second terminal of one of the first, second and third capacitors which is not applied the two reference voltages with a predetermined value, in order to calculate the analog-to-digital converted value at the Nth most significant bit, while the two reference voltages for obtaining the analog-to-digital converted value at the (N+1)th most significant bit are applied to the first terminal of two of the first capacitor, the second capacitor, and the third capacitor.

3. The analog-to-digital converter of claim 1, wherein the charging timing controller is configured to control the reference voltage generator to apply a reference voltage in order to obtain the analog-to-digital converted value at the Nth most significant bit to the first terminal of one of the first capacitor, the second capacitor, and the third capacitor, and simultaneously to apply two reference voltages in order to obtain the analog-to-digital converted value at the (N+1)th most significant bit to the first terminal of two capacitors not applied the reference voltage, and the comparing timing controller is configured to control the comparator to compare a voltage at the second terminal of the capacitor controlled by the comparing timing controller with the first terminal of the capacitor applied with the reference voltage in order to obtain the analog-to-digital converted value at the Nth most significant bit, with a predetermined value, to calculate the analog-to-digital converted value at the Nth most significant bit, to compare a voltage at the second terminal of one of the first capacitor, the second capacitor, and the third capacitor with the first terminal is applied with the reference voltage according to the analog-to-digital converted value at the Nth most significant bit with a predetermined value, and to determine the analog-to-digital converted value at the (N+1)th most significant bit.

4. The analog-to-digital converter of claim 1, wherein the reference voltage generator comprises:
a series resistor configured to generate a number of n th power of two pieces of divided voltages by dividing a standard voltage where n is a bit width of analog-to-digital conversion; and
a switch configured to input the divided voltages generated by the series resistor to the first terminals of the first capacitor, the second capacitor, and the third capacitor as the first reference voltage, the second reference voltage, and the third reference voltage, respectively.

5. The analog-to-digital converter of claim 1, wherein the reference voltage generator comprises:
n pieces of resistors connected in parallel to a standard voltage where n is a bit width of analog-to-digital conversion;
n pieces of switching circuits connected in series to the n pieces of the resistors; and
an operational amplifier connected to the resistors via the switching circuits.

6. The analog-to-digital converter of claim 1, wherein the comparator comprises:
a selecting circuit configured to select at least one of voltages at the second terminals of the first capacitor, the second capacitor, and the third capacitor, and to cause the comparator to compare the voltage with a predetermined value;
an operational amplifier configured to compare the voltage selected by the selecting circuit with the predetermined value, and to output a result of comparison as an analog-to-digital converted value at the Nth most significant bit; and
a fourth switching circuit configured to connect the second terminals of the first capacitor, second capacitor, and third capacitor to a predetermined potential while the analog input voltage is sampled via the first terminals of the first capacitor, the second capacitor, and the third capacitor.

7. The analog-to-digital converter of claim 6, wherein the fourth switching circuit is configured to connect the second terminals of the first capacitor, the second capacitor, and the third capacitor to a ground potential while the analog input voltage is sampled via the first terminals of the first capacitor, the second capacitor, and the third capacitor.

8. The analog-to-digital converter of claim 6, wherein the fourth switching circuit is configured to connect the second terminals of the first capacitor, the second capacitor, and the third capacitor to an output terminal of the operational amplifier while the analog input voltage is sampled via the first terminals of the first capacitor, the second capacitor, and the third capacitor.

9. The analog-to-digital converter of claim 1, wherein the comparator comprises:
a first field effect transistor, a second field effect transistor, and a third field effect transistor whose gates are connected to the second terminal of the first capacitor, the second capacitor, and the third capacitor, respectively;
a fourth switching circuit configured to select at least one of drains of the first field effect transistor, the second field effect transistor, and the third field effect transistor;
a fourth field effect transistor configured to output a difference between an electric current flowing in the drain selected by the fourth switching circuit with an electric current flowing in a drain of the fourth field effect transistor; and a fifth switching circuit configured to connect the second terminals of the first capacitor, the second capacitor, and the third capacitor to a predetermined potential while the analog input voltage is sampled via the first terminals of the first capacitor, the second capacitor, and the third capacitor.

10. The analog-to-digital converter of claim 1, further comprising a successive approximation register configured to hold an output from the comparator.

11. An analog-to-digital converter comprising:
a first capacitor, a second capacitor, and a third capacitor each configured to sample an analog input voltage in cooperation with a first switching circuit, a second switching circuit, and a third switching circuit, respectively;
a fourth switching circuit configured to connect the first capacitor and the second capacitor with each other;
a fifth switching circuit configured to connect the second capacitor and the third capacitor with each other;
a reference voltage generator configured to generate a first reference voltage, a second reference voltage, and a third reference voltage for the first capacitor, the second capacitor, and the third capacitor, respectively, to apply the first reference voltage, the second reference voltage, and the third reference voltage to first terminals of the first capacitor, the second capacitor, and the third capacitor, respectively;
a comparator between the analog input voltage and the first reference voltage, the second reference voltage, and the third reference voltage configured to compare a voltage at second terminals of the first capacitor, the second capacitor, and the third capacitor with a predetermined value;
a more significant bit conversion controller configured to control the reference voltage generation circuit to apply two reference voltages for obtaining the analog-to-digital converted value at the (N+1)th most significant bit to the first terminals of two of the first capacitor, the second capacitor, and the third capacitor, and to control the comparator to determine the analog-to-digital converted value at the (N+1)th most significant bit by controlling the comparator to compare a voltage at second terminals of the first capacitor, the second capacitor, and the third capacitor with the first terminal applied with the reference voltage according to the analog-to-digital converted value at the Nth most significant bit with a predetermined value, after the analog-to-digital converted value at the Nth most significant bit is determined, for Mth most significant bits, before the analog-to-digital converted value at Nth most significant bit is determined with the fourth and the fifth switching circuits turned off, where M and N are natural numbers and M is equal to or larger than N; and
a less significant bit conversion controller configured to controls the reference voltage generation circuit to apply a reference voltage for obtaining the analog-to-digital converted value at a Kth most significant bit to the first terminal of the first capacitor, the second capacitor, and the third capacitor where K is an integer larger than or equal to (M+l), with the first terminal of the first capacitor, the second capacitor, and the third capacitor connected with each other by turning on the fourth switching circuit and the fifth switching circuit, and to control the comparator to determine the analog-to-digital converted value at the Kth most significant bit by controlling the comparator to compare a voltage at the another terminal of each of the first capacitor, the second capacitor, and the third capacitor with the first terminal applied with the reference voltage with a predetermined value, for the (M+1)th most significant bit or the bits less significant.

12. The analog-to-digital converter of claim 11, wherein the more significant bit conversion controller is configured to control the comparator to compare a voltage at the second terminal of one of the first capacitor, the second capacitor, and the third capacitor which is not applied the two reference voltages with a predetermined value, and to calculate the analog-to-digital converted value at the Nth most significant bit, while the two reference voltages for obtaining the analog-to-digital converted value at the (N+1)th most significant bit are applied to the first terminals of two of the first capacitor, the second capacitor, and the third capacitor.

13. The analog-to-digital converter of claim 11, wherein the more significant bit conversion controller is configured to control the reference voltage generator to apply a reference voltage for obtaining the analog-to-digital converted value at the Nth most significant bit to the first terminal of one of the first capacitor, the second capacitor, and the third capacitor, and simultaneously to apply two reference voltages for obtaining the analog-to-digital converted value at the (N+1)th most significant bit to the first terminal of the two capacitors not applied the reference voltage, and to control the comparator to compare a voltage at the second terminal of the capacitor with the terminal applied with the reference voltage for obtaining the analog-to-digital converted value at the Nth most significant bit with a predetermined value, to calculate the analog-to-digital converted value at the Nth most significant bit, and to compare a voltage at the second terminal of one of the first capacitor, the second capacitor, and the third capacitor with the terminal applied with the reference voltage according to the analog-to-digital converted value at the Nth most significant bit with a predetermined value, in order to determine the analog-to-digital converted value at the (N+1)th most significant bit.

14. The analog-to-digital converter of claim 11, wherein the reference voltage generator comprises:
a series resistor configured to generate a number of nth power of two pieces of divided voltages by dividing a standard voltage where n is a bit width of analog-to-digital conversion; and
a switch configured to input the divided voltages generated by the series resistor to the first terminals of the first capacitor, the second capacitor, and the third capacitor as the first reference voltage, the second reference voltage, and the third reference voltage, respectively.

15. The analog-to-digital converter of claim 11, wherein the reference voltage generator comprises:
n pieces of resistors connected in parallel to a standard voltage where n is a bit width of analog-to-digital conversion;
n pieces of switching circuits each connected in series to the n pieces of the resistors; and
an operational amplifier connected to the resistors via the switching circuits.

16. The analog-to-digital converter of claim 11, wherein the comparator comprises:
a selecting circuit configured to select at least one of voltages at the second terminals of the first capacitor, the second capacitor, and the third capacitor, and to cause the comparator to compare the voltage with a predetermined value;
an operational amplifier configured to compare the voltage selected by the selecting circuit with the predetermined value, and to output a result of comparison as an analog-to-digital converted value at the Nth. most significant bit; and
a fourth switching circuit configured to connect the second terminals of the first capacitor, second capacitor, and third capacitor to a predetermined potential while the analog input voltage is sampled via the first terminals of the first capacitor, the second capacitor, and the third capacitor.

17. The analog-to-digital converter of claim 16, wherein the sixth switching circuit is configured to connect the second terminals of the first capacitor, the second capacitor, and the third capacitor to a ground potential while the analog input voltage is sampled via the first terminals of the first capacitor, the second capacitor, and the third capacitor.

18. The analog-to-digital converter of claim 16, wherein the sixth switching circuit is configured to connect the second terminals of the first capacitor, the second capacitor, and the third capacitor to an output terminal of the operational amplifier while the analog input voltage is sampled via the first terminal of the first capacitor, the second capacitor, and the third capacitor.

19. The analog-to-digital converter of claim 11, wherein the comparator comprises:
a first field effect transistor, a second field effect transistor, and a third field effect transistor whose gates are connected to the second terminal of the first capacitor, the second capacitor, and the third capacitor, respectively;
a sixth switching circuit configured to select at least one of drains of the first field effect transistor, the second field effect transistor, and the third field effect transistor;
a fourth field effect transistor configured to output a difference between an electric current flowing in the drain selected by the sixth switching circuit with an electric current flowing in a drain of the fourth field effect transistor; and
a seventh switching circuit configured to connect the second terminals of the first capacitor, the second capacitor, and the third capacitor to a predetermined potential while the analog input voltage is sampled via the first terminals of the first capacitor, the second capacitor, and the third capacitor.

20. An analog-to-digital converter comprising:
a first capacitor, a second capacitor, and a third capacitor each configured to sample an analog input voltage in cooperation with a first switching circuit, a second switching circuit, and a third switching circuit, respectively;
a reference voltage generator configured to generate a first reference voltage, a second reference voltage, and a third reference voltage, for the first capacitor, the second capacitor, and the third capacitor, respectively, and to apply the first reference voltage, the second reference voltage, and the third reference voltage to first terminals of the first capacitor, the second capacitor, and the third capacitor, respectively;
a comparator between the analog input voltage and the first reference voltage, the second reference voltage, and the third reference voltage configured to compare a voltage at second terminals of the first capacitor, the second capacitor, and the third capacitor with a predetermined value; and
a control circuit configured to control charge timings either during a previous comparison for a current comparison or while the reference voltages generated by the reference voltage generator are applied to the first capacitor, the second capacitor, and the third capacitor.

* * * * *